United States Patent
Katayama

(10) Patent No.: US 8,807,769 B2
(45) Date of Patent: Aug. 19, 2014

(54) WAVELENGTH PLATE, LIGHT EMITTING ELEMENT, AND IMAGE DISPLAY DEVICE USING THE LIGHT EMITTING ELEMENT

(75) Inventor: Ryuichi Katayama, Tokyo (JP)

(73) Assignee: NEC Corporation, Tokyo (JP)

( * ) Notice: Subject to any disclaimer, the term of this patent is extended or adjusted under 35 U.S.C. 154(b) by 108 days.

(21) Appl. No.: 13/577,033

(22) PCT Filed: Jan. 12, 2011

(86) PCT No.: PCT/JP2011/050353
§ 371 (c)(1),
(2), (4) Date: Aug. 3, 2012

(87) PCT Pub. No.: WO2011/125350
PCT Pub. Date: Oct. 13, 2011

(65) Prior Publication Data
US 2013/0021773 A1    Jan. 24, 2013

(30) Foreign Application Priority Data
Apr. 6, 2010    (JP) .................................. 2010-087805

(51) Int. Cl.
  *F21V 13/08* (2006.01)
  *G02B 5/30* (2006.01)
(52) U.S. Cl.
  USPC ........................................ 362/19; 359/485.01
(58) Field of Classification Search
  CPC ..... G02B 1/005; G02B 5/3025; G02B 5/3033
  USPC ........................... 362/19; 359/485.01–485.05
  See application file for complete search history.

(56) References Cited

U.S. PATENT DOCUMENTS 6,977,774 B1    12/2005    Kawakami et al.
8,432,353 B2 *  4/2013     Nagata et al. .................. 345/102

FOREIGN PATENT DOCUMENTS

| CN | 1467514 A | 1/2004 |
|---|---|---|
| EP | 1 103 829 A1 | 5/2001 |
| JP | 2000056133 A | 2/2000 |
| JP | 2000-258645 A | 9/2000 |
| JP | 2001051122 A | 2/2001 |
| JP | 2001083321 A | 3/2001 |
| JP | 2009128879 A | 6/2009 |
| WO | 2004113974 A1 | 12/2004 |

OTHER PUBLICATIONS

The international search report for PCT/JP2011/050353, dated Feb. 15, 2011.
Chinese Office Action for CN Application No. 201180013434.X issued on May 4, 2014 with English Translation.

* cited by examiner

*Primary Examiner* — Stephen F Husar
*Assistant Examiner* — James Cranson, Jr.
(74) *Attorney, Agent, or Firm* — Sughrue Mion, PLLC

(57) ABSTRACT

Provided is a wavelength plate that can increase incident angle tolerance. The wavelength plate in which a high refractive index layer and a low refractive index layer are alternately stacked, each layer having a concave-convex structure the period of which is equal to or shorter that a wavelength in one direction within a plane, includes, as periods in the thickness direction of the high refractive index layer and the low refractive tive index layer: a first period defined so that a used wavelength can belong to the first band of a photonic band structure; and a second period defined so that the used wavelength can belong to a wavelength side longer than the center wavelength of the second band of the photonic band structure.

3 Claims, 24 Drawing Sheets

WAVELENGTH PLATE, LIGHT EMITTING ELEMENT, AND IMAGE DISPLAY DEVICE USING THE LIGHT EMITTING ELEMENT

TECHNICAL FIELD

The present invention relates to a light emitting element that emits linearly polarized light, and an image display device that uses the light emitting element.

BACKGROUND ART

There has been offered an image display device that uses a light emitting diode (LED) as a light emitting element. The image display device of this type is configured by including a plurality of LEDs for respectively emitting lights of red (R), green (G), and blue (B) colors, an illumination optical system into which the lights from the plurality of LEDs enter, a light bulb including a liquid crystal display panel into which the lights from the illumination optical system enter, a color synthesis prism for synthesizing the lights of the respective colors from the light bulb, and a projection optical system for projecting the lights from the color synthesis prism onto a projection screen.

In the image display device thus configured, to increase the luminance of a projected image, it is required to prevent light loss as much as possible in an optical path from the light emitting element to the projection optical system.

Among the aforementioned components, the liquid crystal display panel and the color synthesis prism are polarization-dependent. To achieve high efficiency of the optical system, therefore, the light emitting element advisably emits linearly polarized light.

As the light emitting element for emitting linearly polarized light, a light emitting element that includes a polarizer, a wavelength plate, and a reflection layer can be employed.

As a light emitting element that includes the polarizer, the wavelength plate, and the reflection layer, there is an element that reflects the light reflected by the polarizer on the reflection layer via the wavelength plate, and that changes a polarizing direction again via the wavelength plate to enter the light into the polarizer, and an element that enters the light into first and second polarizers through which polarized lights orthogonal to each other are passed, that provides a phase difference to the light passed through one of the polarizers by the wavelength plate to change the polarizing direction, and accordingly that emits the lights passed through the first and second polarizers as linearly polarized lights made uniform in a polarizing direction.

In the light emitting element thus configured, the wavelength plate for changing the polarizing direction is important. Generally, the wavelength plate has a narrow permissible range of incident angles to function as the wavelength plate, and thus widening the incident angle permissible range of the wavelength is one of the important factors for improving the performance of the light emitting element.

Patent Literature 1 (JP2001-51122A) discloses, for the purpose of providing a birefringent element tat is industrially manufacturable at low costs, and that exhibits large birefringence having an optical axis within a plane, and is permitted a large opening area with a small optical path length, a periodic structure that is a z-axis direction multilayer structure including two or more types of transparent members whose refractive index in three dimensional orthogonal coordinates x, y and z: a shape of a layer as a stacking unit for each transparent member having a periodic concave-convex structure in an x axis direction and a periodic or nonperiodic concave-convex structure of a length uniform or larger than that in the x axis direction and in a y axis direction, and layers being stacked in a z axis direction by repeating the shape at each period shorter than a first Bragg condition in the z direction. By entering light to this periodic structure vertically or obliquely to an xy surface, and providing a phase difference between a polarized wave having an electric field component in the x direction and a polarized wave having an electric field component in the y direction, the periodic structure is used as a phase plate.

Patent Literature 2 (WO2004-113974A1) discloses, for the purpose of expanding the operation band of a polarization separation element and increasing incident angle tolerance, a configuration for gradually changing a stacking period in the z direction with respect to the configuration disclosed in Patent Literature 1.

CITATION LIST

Patent Literature

Patent Literature 1: JP2001-51122A
Patent Literature 2: WO2004-113974A1

SUMMARY OF INVENTION

Problems to be Solved by Invention

According to the invention described in Patent Literature 2, the stacking period in the z direction is gradually changed. However, since the stacking period for the used wavelength is used as the polarization separation element, the stacking period is defined to be located in a band gap for polarized light (TE polarized light) parallel to the longitudinal direction of the concave-convex structure, and is located in a band for polarized light (TM polarized light) vertical to the longitudinal direction of the concave-convex structure. As a result, the stacking structure cannot be used as a wavelength plate.

The present invention provides a wavelength plate capable of achieving high incident angle tolerance, a light emitting element capable of emitting linearly polarized light within a wide angle range, and an image display device that can achieve high light use efficiency.

Solution to Problems

According to the present invention, a wavelength plate in which a high refractive index layer and a low refractive index layer are alternately stacked, each layer having a concave-convex structure the period of which is equal to or shorter that a wavelength in one direction within a plane, includes, as periods in the thickness direction of the high refractive index layer and the low refractive index layer:

a first period defined so that a used wavelength can belong to the first band of a photonic band structure; and a second period defined so that the used wavelength can belong to a wavelength side longer than the center wavelength of the second band of the photonic band structure.

According to the present invention, a light emitting element having the aforementioned wavelength plate includes:

a light emitting layer for emitting light;

a polarizer and the wavelength plate arranged on an exit surface side with respect to the light emitting layer; and a reflection layer disposed on a side opposite the exit surface with respect to the light emitting layer.

According to the present invention, an image display device uses the light emitting element of the aforementioned configuration.

Effects of Invention

In the wavelength plate configured as described above, incident angle tolerance can be increased. Thus, the light emitting element using this wavelength plate can emit linearly polarized light within a wide angle range, and the image display device using this light emitting element can achieve high light use efficiency.

BRIEF DESCRIPTION OF DRAWINGS

FIG. 2A showing the photonic band structure for normal incidence in design example 1-1, and FIG. 2B showing the photonic band structure for normal incidence in design example 1-2.

FIG. 3A showing the incident angle dependency within an X-Z plane, and FIG. 3B showing the incident angle dependency within a Y-Z plane.

FIG. 4A showing the incident angle dependency within the X-Z plane, and FIG. 4B showing the incident angle dependency within the Y-Z plane.

FIG. 5A showing the incident angle dependency within the X-Z plane, and FIG. 5B showing the incident angle dependency within the Y-Z plane.

FIG. 7A showing the photonic band structure for normal incidence in design example 2-1, and FIG. 7B showing the photonic band structure for normal incidence in design example 2-2.

FIG. 8A showing the incident angle dependency within the X-Z plane, and FIG. 8B showing the incident angle dependency within the Y-Z plane.

FIG. 9A showing the incident angle dependency within the X-Z plane, and FIG. 9B showing the incident angle dependency within the Y-Z plane.

FIG. 10A showing the incident angle dependency within the X-Z plane, and FIG. 10B showing the incident angle dependency within the Y-Z plane.

FIG. 13A showing the relationship for P-polarized light, and FIG. 13B showing the relationship for S-polarized light.

FIG. 14A showing the relationship within the X-Z plane, and FIG. 14B showing the relationship within the plane Y-Z.

FIG. 15A showing the relationship within the X-Z plane, and FIG. 15B showing the relationship within the plane Y-Z.

FIG. 16A showing the photonic band structure for normal incidence in design example 1-4, and FIG. 16B showing the photonic band structure for normal incidence in design example 1-5.

FIG. 17A showing the incident angle dependency within the X-Z plane, and FIG. 17B showing the incident angle dependency within the Y-Z plane.

FIG. 18A showing the incident angle dependency within the X-Z plane, and FIG. 18B showing the incident angle dependency within the Y-Z plane.

DESCRIPTION OF EMBODIMENTS

Figure 1:
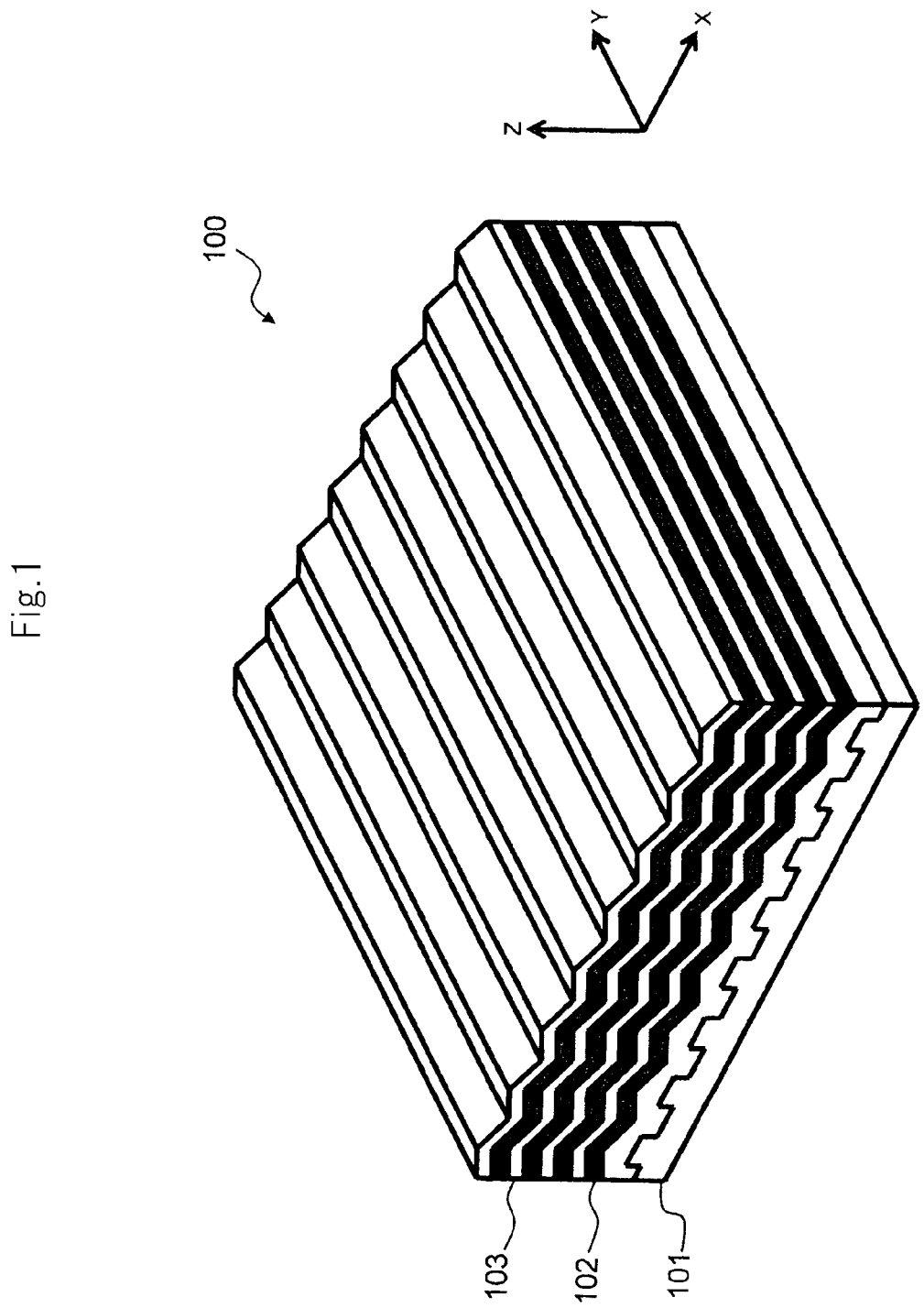
FIG. 1 A perspective view showing the configuration of a wavelength plate according to an embodiment of the present invention.

Hereinafter, the specific embodiments of the present invention will be described with reference to the accompanying drawings. FIG. 1 is a perspective view showing the configuration of a wavelength plate according to an embodiment of the present invention.

Wavelength plate 100 according to this embodiment is configured by alternately stacking high refractive index layer 102 and low refractive index layer 103 on substrate 101.

On substrate 101, there are formed concave and convex portions uniform in a Y direction but at a period of 150 nanometers in an X direction orthogonal to the Y direction. On substrate 101 having such concave and convex portions formed thereon, high refractive index layer 102 of $Nb_2O_5$ and low refractive index layer 103 of $SiO_2$ are stacked. As shown, each of these layers is formed into a shape periodically bent with the convex center of substrate 101 set as the apex of a height.

A table below shows the numbers of stacked high refractive index layers 102 and low refractive index layers 103 and thicknesses in design examples 1-1 and 1-2 as Comparative Examples and design example 1-3 as an Example. These are design examples of ½ wavelength plates.

TABLE 1

| Period (high refractive index layer + low refractive index layer) | | number of layers |
|---|---|---|
| Design example 1-1 | | |
| L1 | 40 nm + 40 nm | 100 |
| Design example 1-2 | | |
| L1 | 80 nm + 80 nm | 44 |
| Design example 1-3 | | |
| L1 | 40 nm + 40 nm | 48 |
| L2 | 80 nm + 80 nm | 24 |

Figure 2:
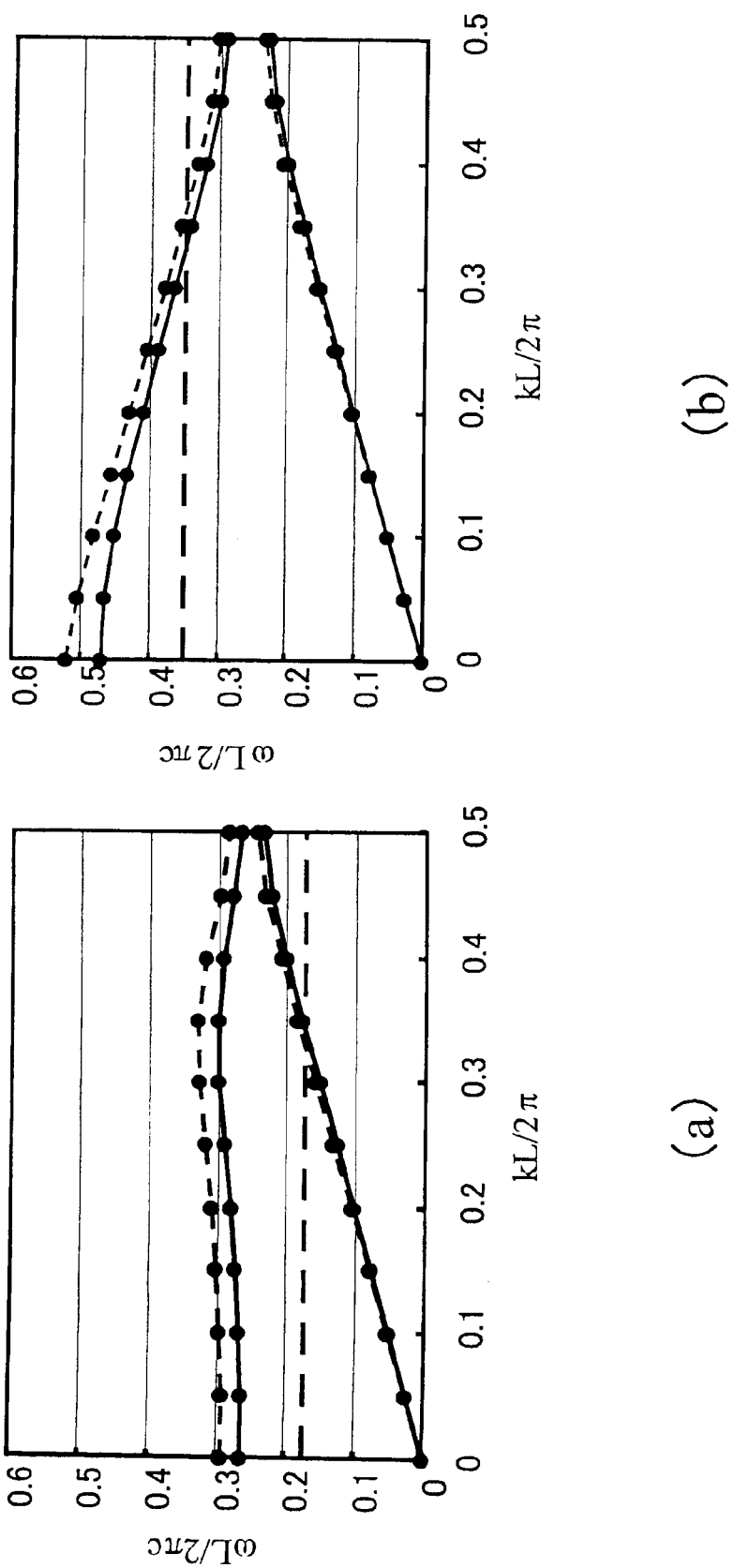
FIGS. 2A and 2B Views showing a photonic band structure.

FIG. 2A shows a photonic band structure for normal incidence in design example 1-1, and FIG. 2B shows a photonic band structure for normal incidence in design example 1-2. In both Figures, a vertical axis indicates a normalized angular frequency ($\omega L/2\pi c$), and a horizontal axis indicates a normalized wavenumber ($kL/2\pi$).

In each Figure, a broken line indicates an incident wavelength of 460 nanometers, a solid line indicates the characteristics of TE polarized light, and a dotted line indicates the characteristics of TM polarized light.

The wavelength of 460 nanometers belongs to a first band in design example 1-1 shown in FIG. 2A, and to a wavelength side longer than the center wavelength of a second band in design example 1-2 shown in FIG. 2B.

Figure 3:
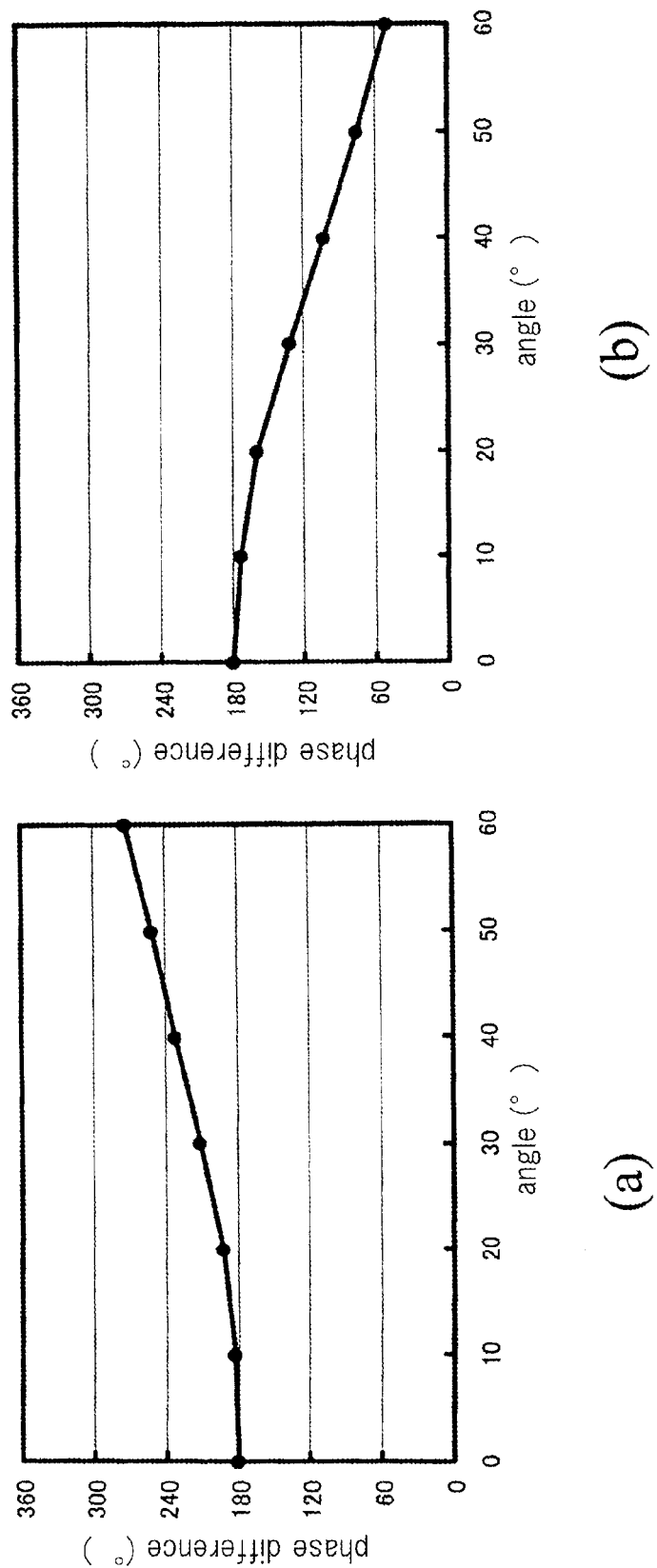
FIGS. 3A and 3B Views showing incident angle dependency in design example 1-1.

FIGS. 3A and 3B show incident angle dependency in design example 1-1: FIG. 3A showing the incident angle dependency within an X-Z plane, and FIG. 3B showing the incident angle dependency within a Y-Z plane. In each Figure, a vertical axis indicates a phase difference, and a horizontal axis indicates an incident angle.

With the increase of the incident angle, the phase difference increases within the X-Z plane as shown in FIG. 3A, while the phase difference decreases within the Y-Z plane as shown in FIG. 3B.

Figure 4:
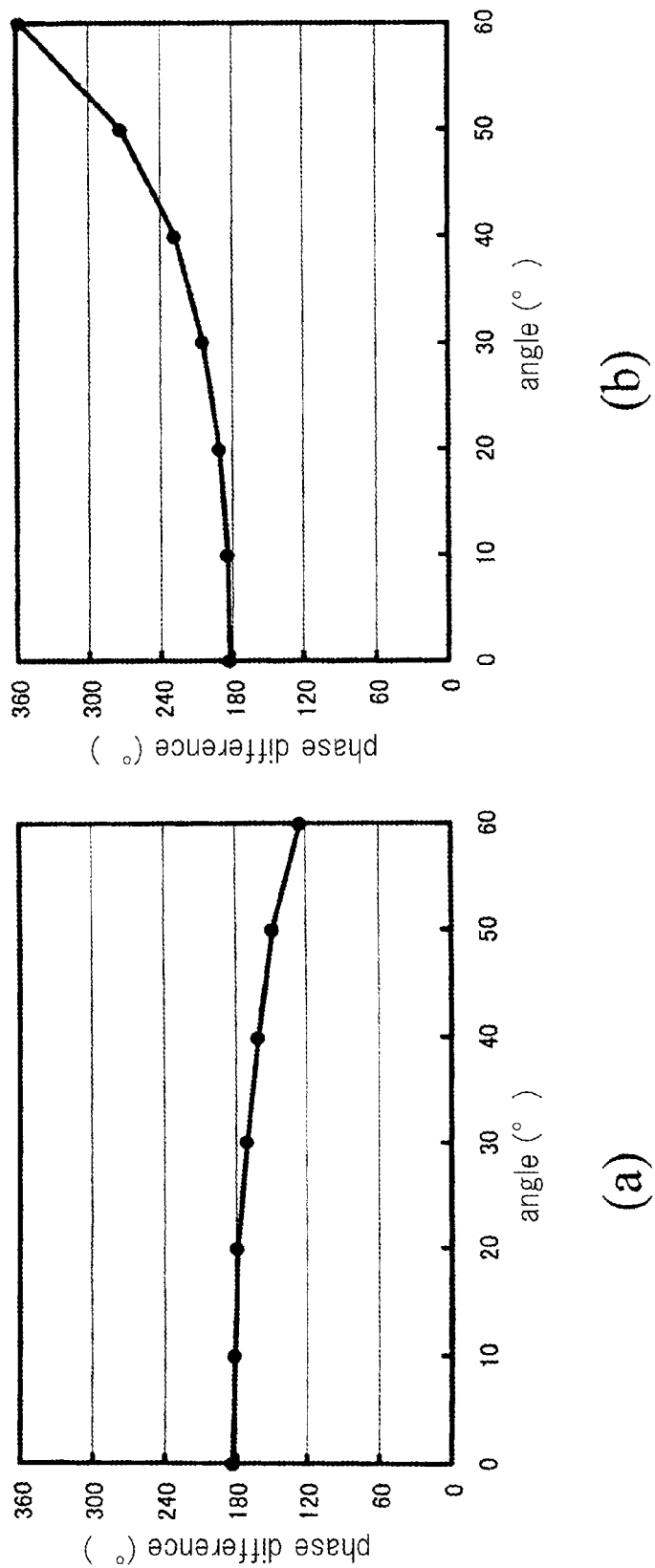
FIGS. 4A and 4B Views showing incident angle dependency in design example 1-2.

FIGS. 4A and 4B show incident angle dependency in design example 1-2: FIG. 4A shows the incident angle dependency within the X-Z plane, and FIG. 4B shows the incident angle dependency within the Y-Z plane. In each Figure, the vertical axis indicates a phase difference, and the horizontal axis indicates an incident angle.

With the increase of the incident angle, the phase difference decreases within the X-Z plane as shown in FIG. 4A, while the phase difference increases within the Y-Z plane as shown in FIG. 4B.

Figure 5:
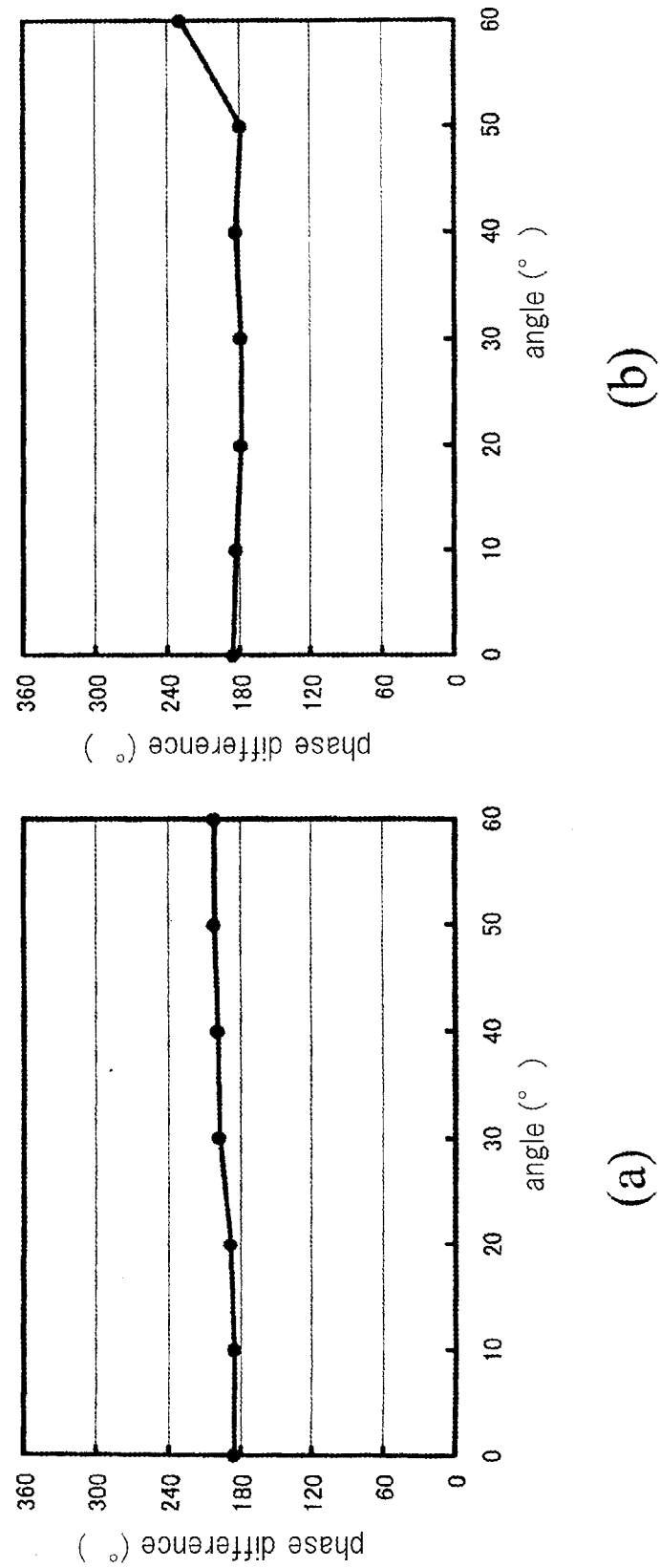
FIGS. 5A and 5B Views showing incident angle dependency in design example 1-3.

FIGS. 5A and 5B show incident angle dependency in design example 1-3: FIG. 5A shows the incident angle dependency within the X-Z plane, and FIG. 5B shows the incident angle dependency within the Y-Z plane. In each Figure, the vertical axis indicates a phase difference, and the horizontal axis indicates an incident angle.

The changes of the phase differences accompanying the increase of the incident angle are suppressed within both the X-Z plane and the Y-Z plane as shown in FIGS. 5A and 5B, because the characteristics shown in FIGS. 3A and 3B and the characteristics shown in FIGS. 4A and 4B cancel each other out.

Figure 6:
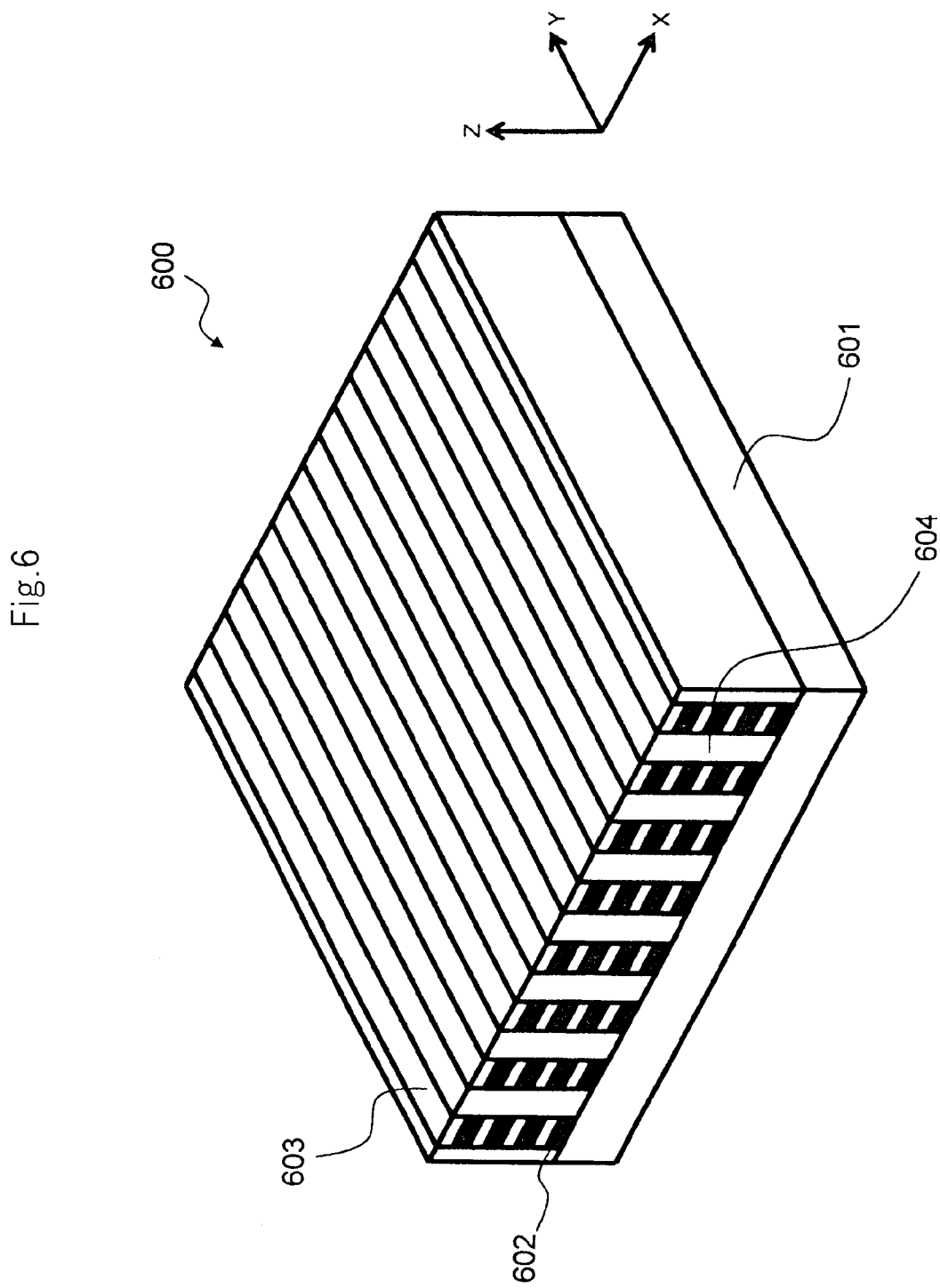
FIG. 6 A perspective view showing the configuration of a wavelength plate according to another embodiment of the present invention.

FIG. 6 is a perspective view showing the configuration of a wavelength plate according to another embodiment of the present invention.

Wavelength plate 600 according to this embodiment is configured by periodically arranging laminates at fixed intervals, each of the laminates being formed by alternately stacking high refractive index layer 602 of $Nb_2O_5$ and low refractive index layer 603 of $SiO_2$ on substrate 601, and forming low refractive index layer 604 of $SiO_2$. between the laminates.

A table below shows the numbers of stacked high refractive index layers 602 and low refractive index layers 603 and thicknesses in design examples 2-1 and 2-2 as Comparative Examples and design example 2-3 as an Example. These are design examples of ½ wavelength plates.

TABLE 2

| Period (high refractive index layer + low refractive index layer) | | number of layers |
|---|---|---|
| Design example 2-1 | | |
| L1 | 40 nm + 40 nm | 31 |
| Design example 2-2 | | |
| L1 | 90 nm + 90 nm | 15 |
| Design example 2-3 | | |
| L1 | 40 nm + 40 nm | 15 |
| L2 | 90 nm + 90 nm | 8 |

Figure 7:
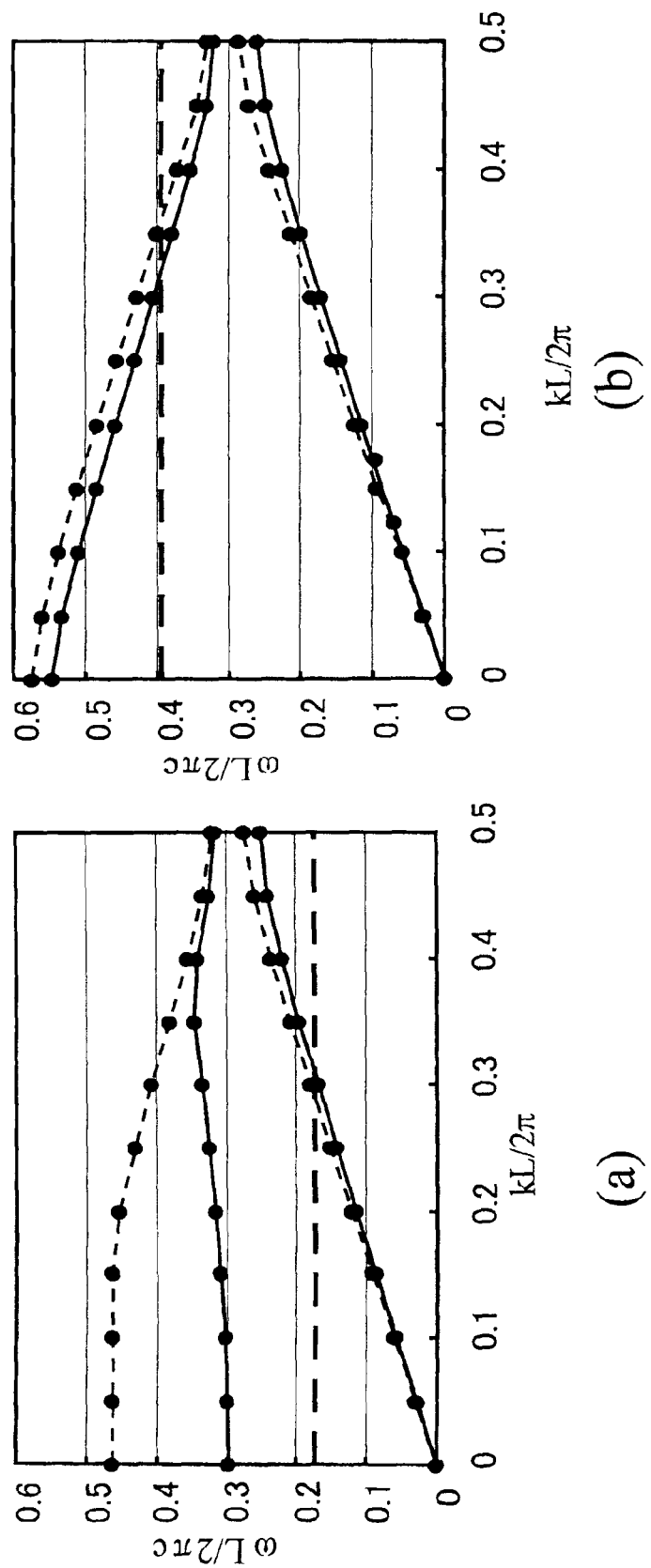
FIGS. 7A and 7B Views showing a photonic band structure.

FIG. 7A shows a photonic band structure for normal incidence in design example 2-1, and FIG. 7B shows a photonic band structure for normal incidence in design example 2-2. In both Figures, a vertical axis indicates a normalized angular frequency ($\omega L/2\pi c$), and a horizontal axis indicates a normalized wavenumber ($kL/2\pi$).

In each Figure, a broken line indicates an incident wavelength of 460 nanometers, a solid line indicates the characteristics of TE polarized light, and a dotted line indicates the characteristics of TM polarized light.

The wavelength of 460 nanometers belongs to a first band in design example 2-1 shown in FIG. 7A, and to a wavelength side that is longer than the center wavelength of a second band in design example 2-2 shown in FIG. 7B.

Figure 8:
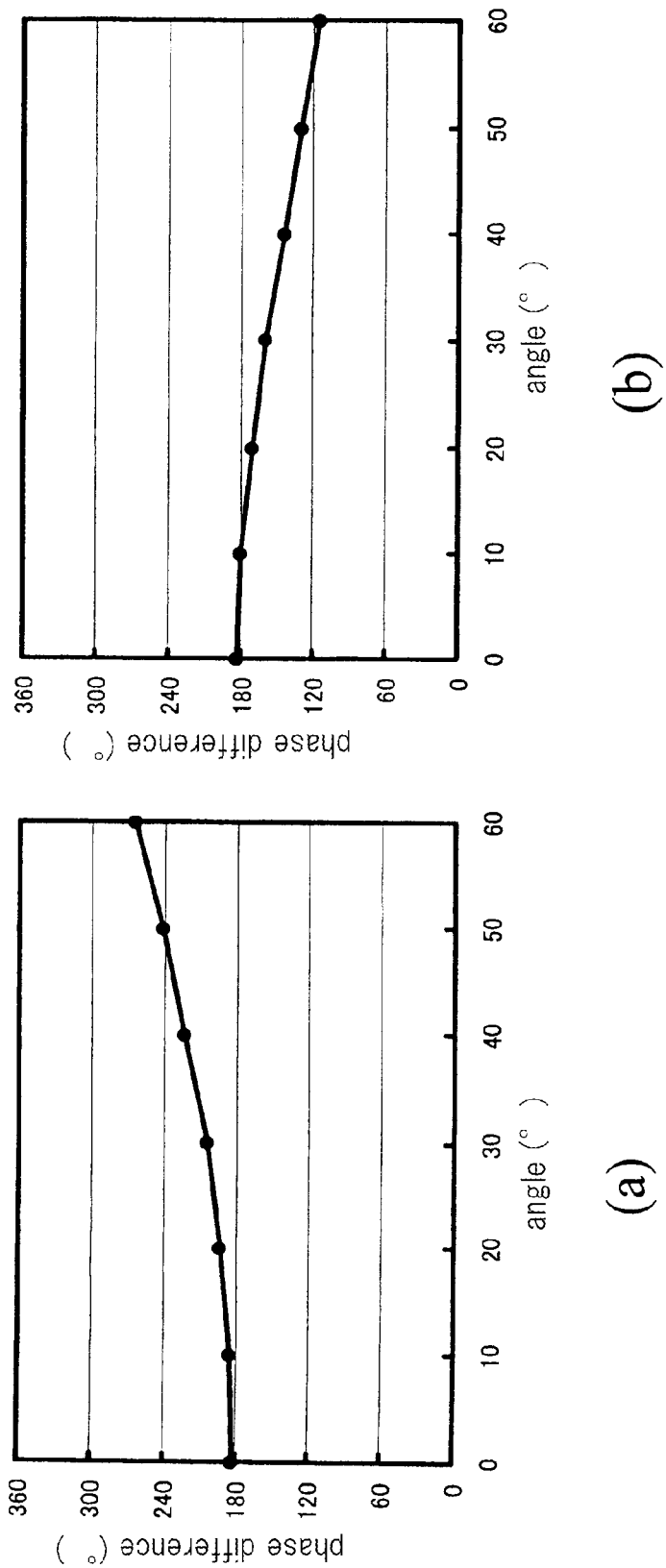
FIGS. 8A and 8B Views showing incident angle dependency in design example 2-1.

FIGS. 8A and 8B show incident angle dependency in design example 2-1: FIG. 8A shows the incident angle dependency within the X-Z plane, and FIG. 8B shows the incident angle dependency within the Y-Z plane. In each Figure, the vertical axis indicates a phase difference, and the horizontal axis indicates an incident angle.

With the increase of the incident angle, the phase difference increases within the X-Z plane as shown in FIG. 8A, while the phase difference decreases within the Y-Z plane as shown in FIG. 8B.

Figure 9:
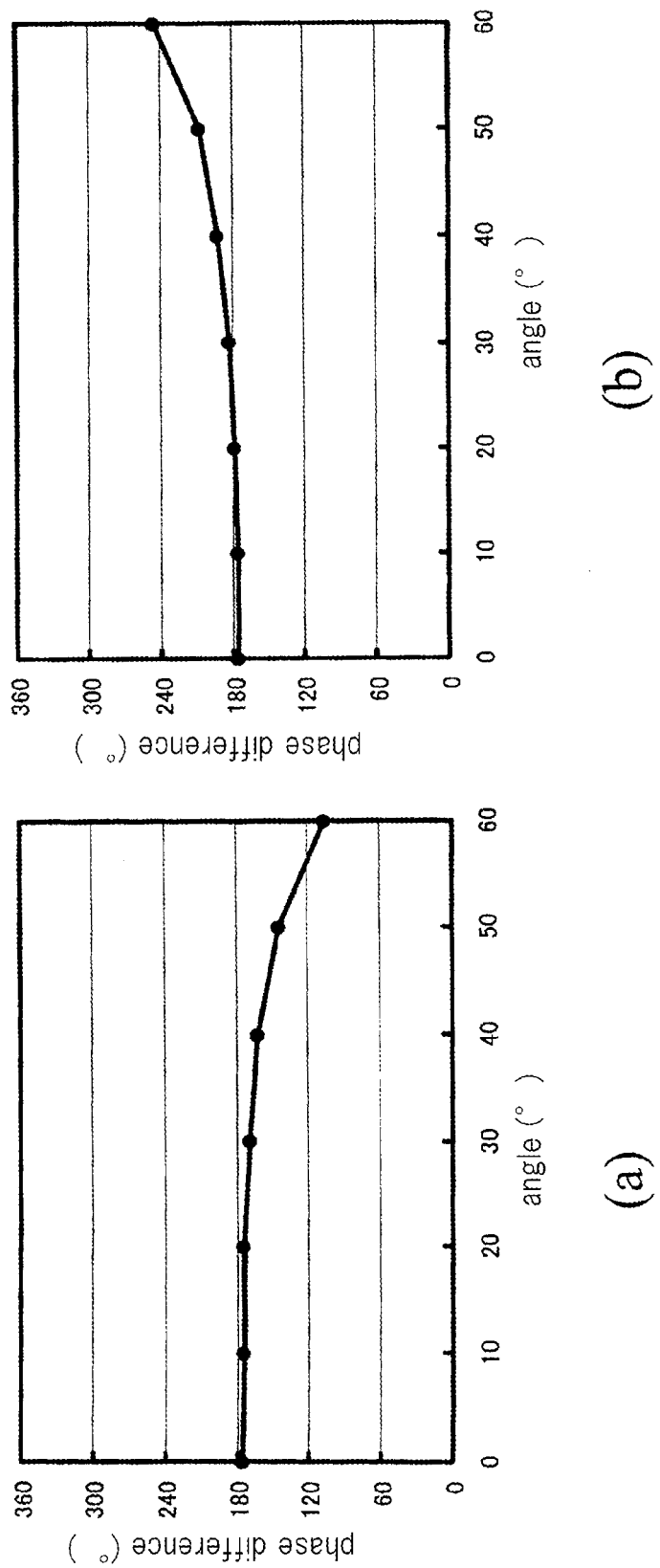
FIGS. 9A and 9B Views showing incident angle dependency in design example 2-2.

FIGS. 9A and 9B show incident angle dependency in design example 2-2: FIG. 9A shows the incident angle dependency within the X-Z plane, and FIG. 9B shows the incident angle dependency within the Y-Z plane. In each Figure, the vertical axis indicates a phase difference, and the horizontal axis indicates an incident angle.

With the increase of the incident angle, the phase difference decreases within the X-Z plane as shown in FIG. 9A, while the phase difference increases within the Y-Z plane as shown in FIG. 9B.

Figure 10:
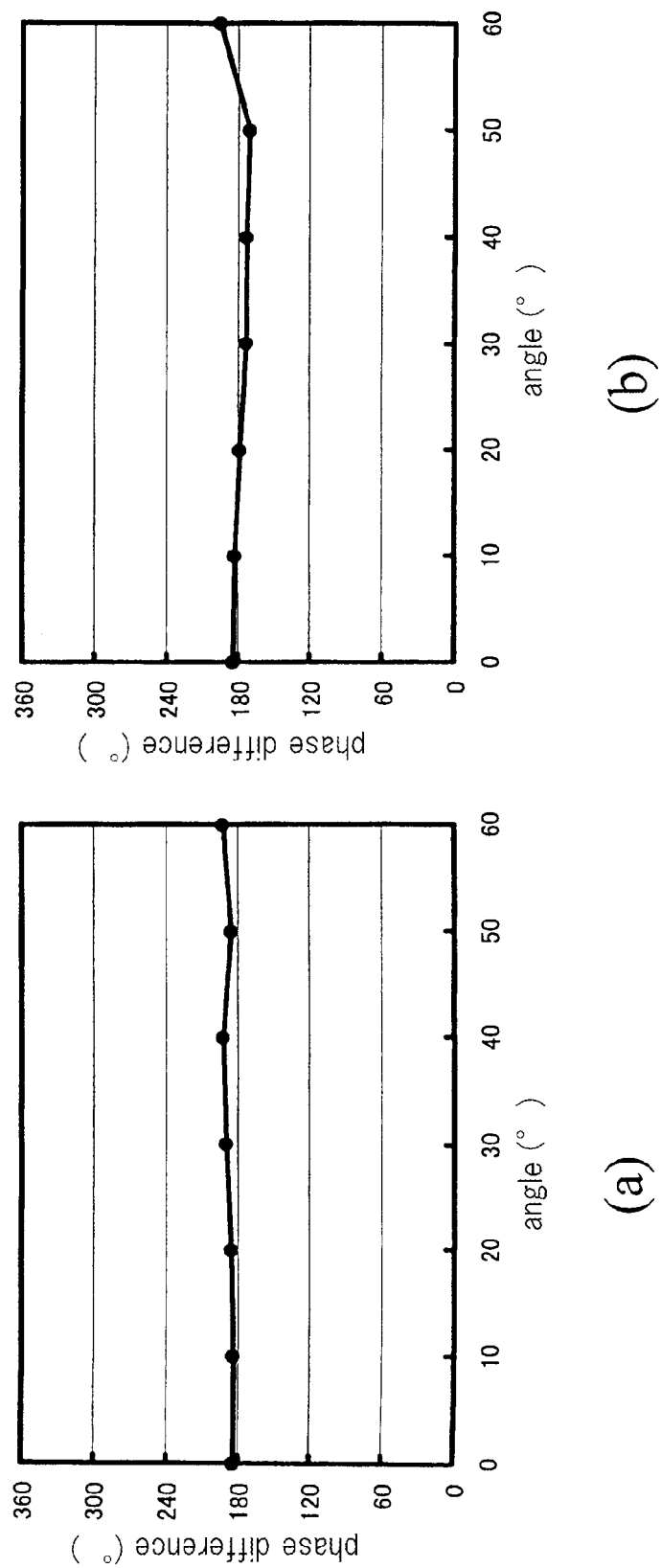
FIGS. 10A and 10B Views showing incident angle dependency in design example 2-3.

FIGS. 10A and 10B show incident angle dependency in design example 2-3: FIG. 10A shows the incident angle dependency within the X-Z plane, and FIG. 10B shows the incident angle dependency within the Y-Z plane. In each Figure, the vertical axis indicates a phase difference, and the horizontal axis indicates an incident angle.

The changes of the phase differences accompanying the increase of the incident angle are suppressed within both the X-Z plane and the Y-Z plane as shown in FIGS. 10A and 10B, because the characteristics shown in FIGS. 8A and 8B and the characteristics shown in FIGS. 9A and 9B cancel each other out.

Referring to FIGS. 11 to 15B, a photonic band structure to realize the aforementioned characteristics will be described.

Figure 11:
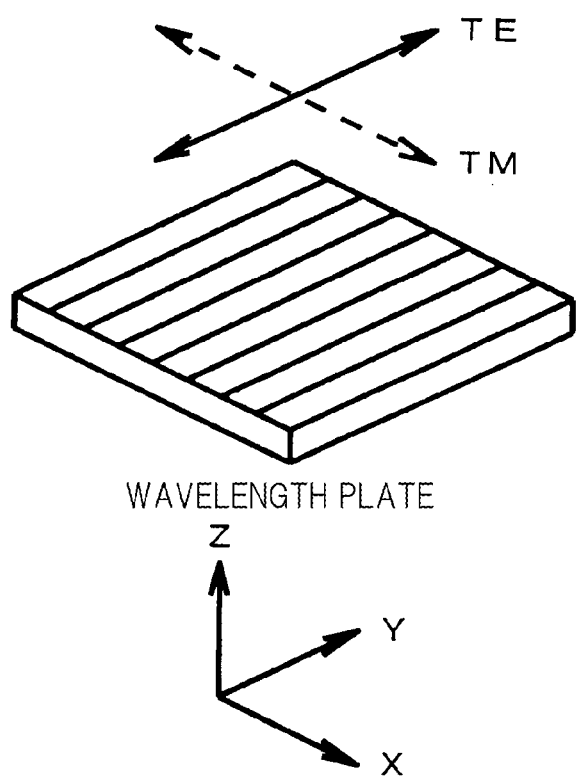
FIG. 11 A view showing a relationship between the concave-convex structure of the wavelength plate and a polarizing direction.

In the case of the wavelength plate having the concave-convex structure shown in FIG. 11, polarized light parallel to the longitudinal direction of the concave-convex structure is TE polarized light, and polarized light vertical to the longitudinal direction of the concave-convex structure is TM polarized light. When a plane of incidence is an X-Z plane, the TE polarized light becomes S-polarized light, and the TM polarized light becomes P-polarized light. Further, when the plane of incidence is a Y-Z plane, the TE polarized light becomes P-polarized light, and the TM polarized light becomes S-polarized light.

Figure 12:
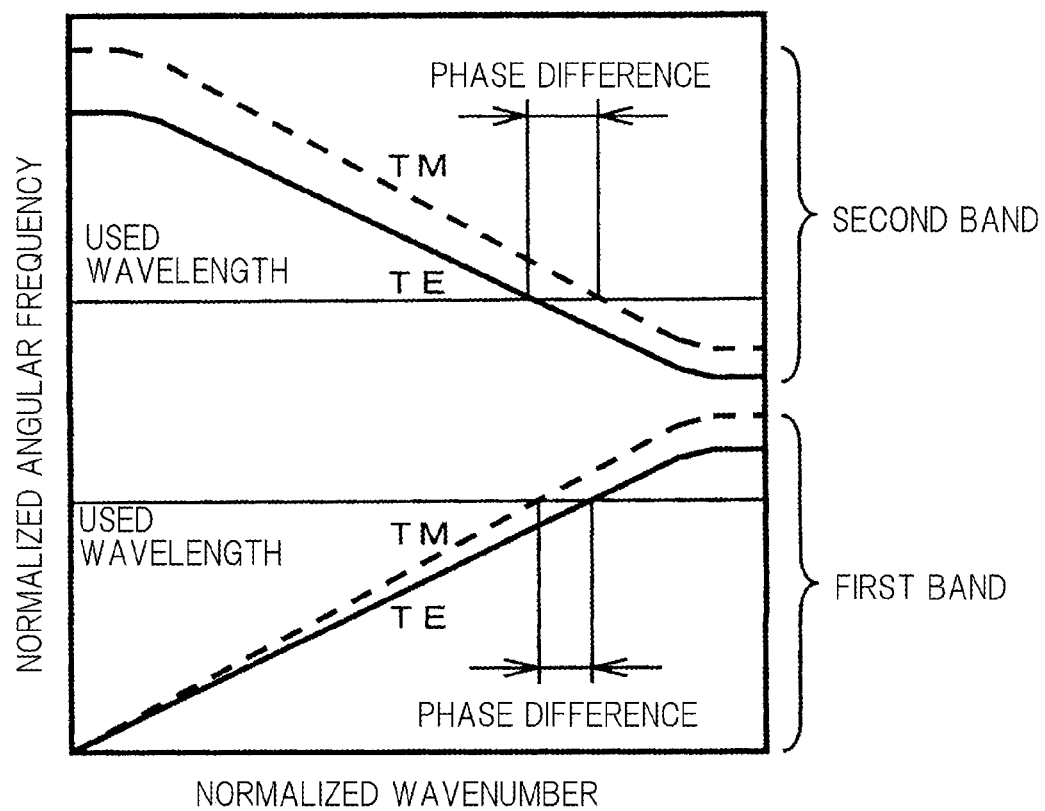
FIG. 12 A view showing a relationship between a normalized angular frequency and a normalized wavenumber in the photonic band structure during the normal incidence.
Figure 13:
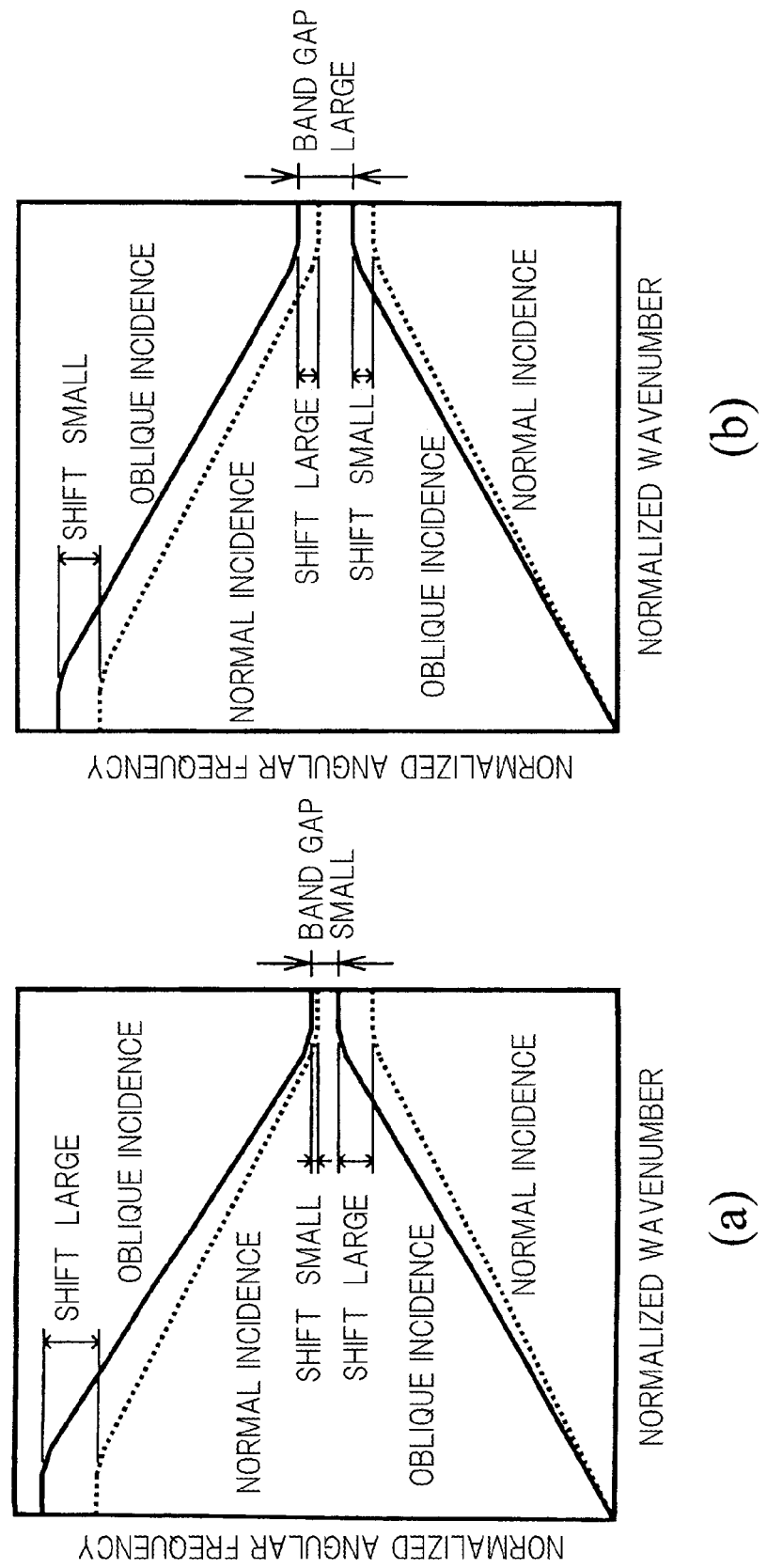
FIGS. 13A and 13B Views showing a relationship between the normalized angular frequency and the normalized wavenumber in the photonic band structure when an incident angle is changed.
Figure 14:
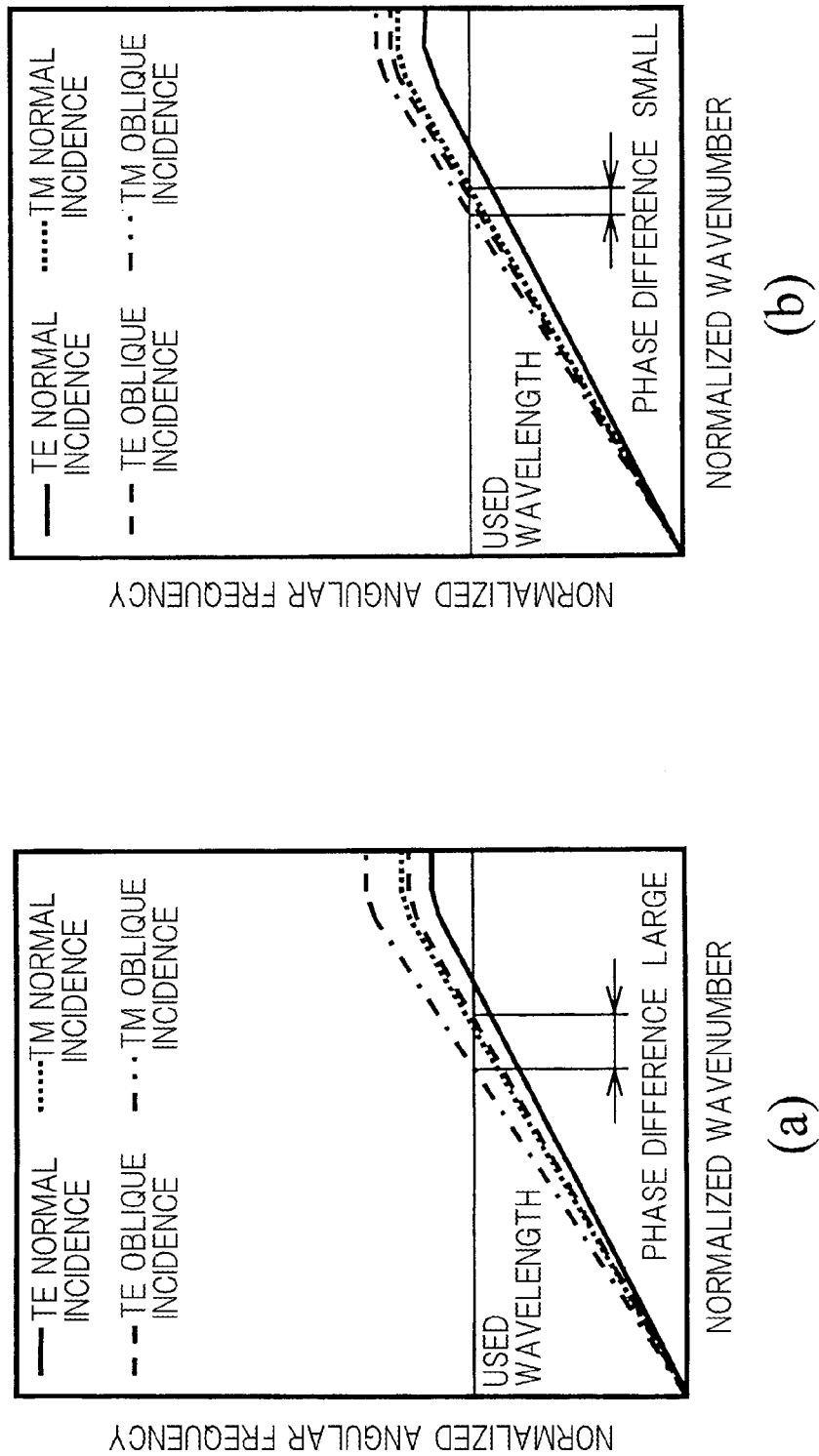
FIGS. 14A and 14B Views showing a relationship between the normalized angular frequency and the normalized wavenumber in the photonic band structure in design examples 1-1 and 2-1 when the incident angle is changed.
Figure 15:
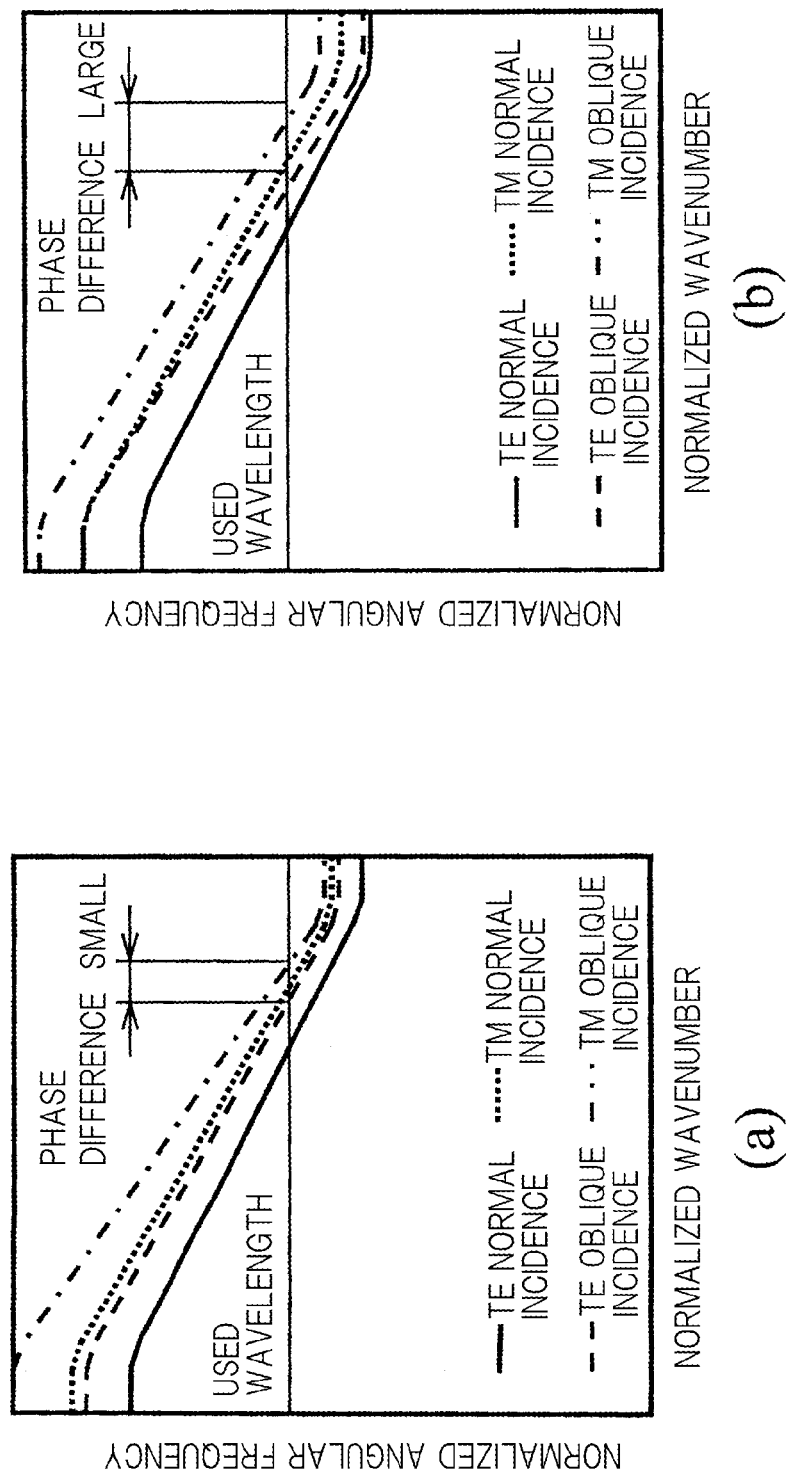
FIGS. 15A and 15B Views showing a relationship between the normalized angular frequency and the normalized wavenumber in the photonic band structure in design examples 1-2 and 2-2 when the incident angle is changed.

FIG. 12 shows the relationship between a normalized angular frequency and a normalized wavenumber in the photonic band structure during the normal incidence. A solid line indicates a relationship for the TE polarized light, and a broken line indicates a relationship for the TM polarized light.

As shown, in both of the first band and the second band, the TM polarized light has a higher frequency side (shorter wavelength side) than the TE polarized light. A difference in normalized wavenumber between the TM polarized light and the TE polarized light in the used wavelength of 460 nanometers is a phase difference.

FIGS. 13A and 13B show a relationship between the normalized angular frequency and the normalized wavenumber in the photonic band structure when an incident angle is changed: FIG. 13A shows the relationship for the P-polarized light, and FIG. 13B shows the relationship for the S-polarized light. In each Figure, a solid line indicates characteristics during oblique incidence, and a dotted line indicates characteristics during normal incidence.

When the incidence angle increases, both the first band and the second band shift to the higher frequency side (shorter wavelength side). In this case, the width of a band gap is larger for the S-polarized light than the P-polarized light. Accordingly, the amount of shifting accompanying the increase of the incident angle is larger for the P-polarized light than the S-polarized light in the first band, and larger for the S-polarized light than the P-polarized light on the wavelength side that is longer than the center wavelength of the second band.

FIGS. 14A and 14B show a relationship between the normalized angular frequency and the normalized wavenumber in the photonic band structure in design examples 1-1 and 2-1 when the incident angle is changed: FIG. 14A shows the relationship within the X-Z plane, and FIG. 14B shows the relationship within the Y-Z plane. In each Figure, a solid line indicates characteristics during normal incidence of the TE polarized light, and a dotted line indicates characteristics during normal incidence of the TM polarized light. A broken line indicates characteristics during oblique incidence of the TE polarized light, and a chain line indicates characteristics during oblique incidence of the TM polarized light.

Within the X-Z plane, as shown in FIG. 14A, the amount of shifting of the first band accompanying the increase of the incident angle is larger for the TM (P) polarized light than the TE (S) polarized light. This means that with the increase of the incident angle, the bands of the TE (S) polarized light and the TM (P) polarized light are distanced from each other, thereby enlarging the phase difference. This can account for the results shown in FIG. 3A and FIG. 8A.

Within the Y-Z plane, as shown in FIG. 14B, the amount of shifting of the first band accompanying the increase of the incident angle is larger for the TE (P) polarized light than for the TM (S) polarized light. This means that with the increase of the incident angle, the bands of the TE (P) polarized light and the TM (S) polarized light approach each other, thereby reducing the phase difference. This can account for the results shown in FIG. 3B and FIG. 8B.

FIGS. 15A and 15B show a relationship between the normalized angular frequency and the normalized wavenumber in the photonic band structure in design examples 1-2 and 2-2 when the incident angle is changed: FIG. 15A shows the relationship within the X-Z plane, and FIG. 15B shows the relationship within the Y-Z plane. In each Figure, a solid line indicates characteristics during normal incidence of the TE polarized light, and a dotted line indicates characteristics during normal incidence of the TM polarized light. A broken line indicates characteristics during oblique incidence of the TE polarized light, and a chain line indicates characteristics during oblique incidence of the TM polarized light.

Within the X-Z plane, as shown in FIG. 15A, the amount of shifting on the wavelength side that is longer than the center wavelength of the second band that accompanies the increase of the incident angle is larger for the TE (S) polarized light than for the TM (P) polarized light. This means that with the increase of the incident angle, the bands of the TE (S) polarized light and the TM (P) polarized light approach each other, thereby reducing the phase difference. This can account for the results shown in FIG. 4A and FIG. 9A.

Within the Y-Z plane, as shown in FIG. 15B, the amount of shifting on the wavelength side that is longer than the center wavelength of the second band that accompanies the increase of the incident angle is larger for the TM (S) polarized light than for the TE (P) polarized light. This means that with the increase of the incident angle, the bands of the TE (P) polarized light and the TM (S) polarized light are distanced from each other, thereby enlarging the phase difference. This can account for the results shown in FIG. 4B and FIG. 9B.

A table below shows the numbers of stacked high refractive index layers 102 and low refractive index layers 103 and thicknesses in design examples 1-4 and 1-5 of wavelength plate 100 as Comparative Examples of the relationships between the photonic structure and the wavelength that is used. These are design examples of ½ wavelength plates.

TABLE 3

| | Period (high refractive index layer + low refractive index layer) | number of layers |
|---|---|---|
| | Design example 1-4 | |
| L3 | 86 nm + 86 nm | 44 |
| | Design example 1-5 | |
| L4 | 100 nm + 100 nm | 42 |

Figure 16:
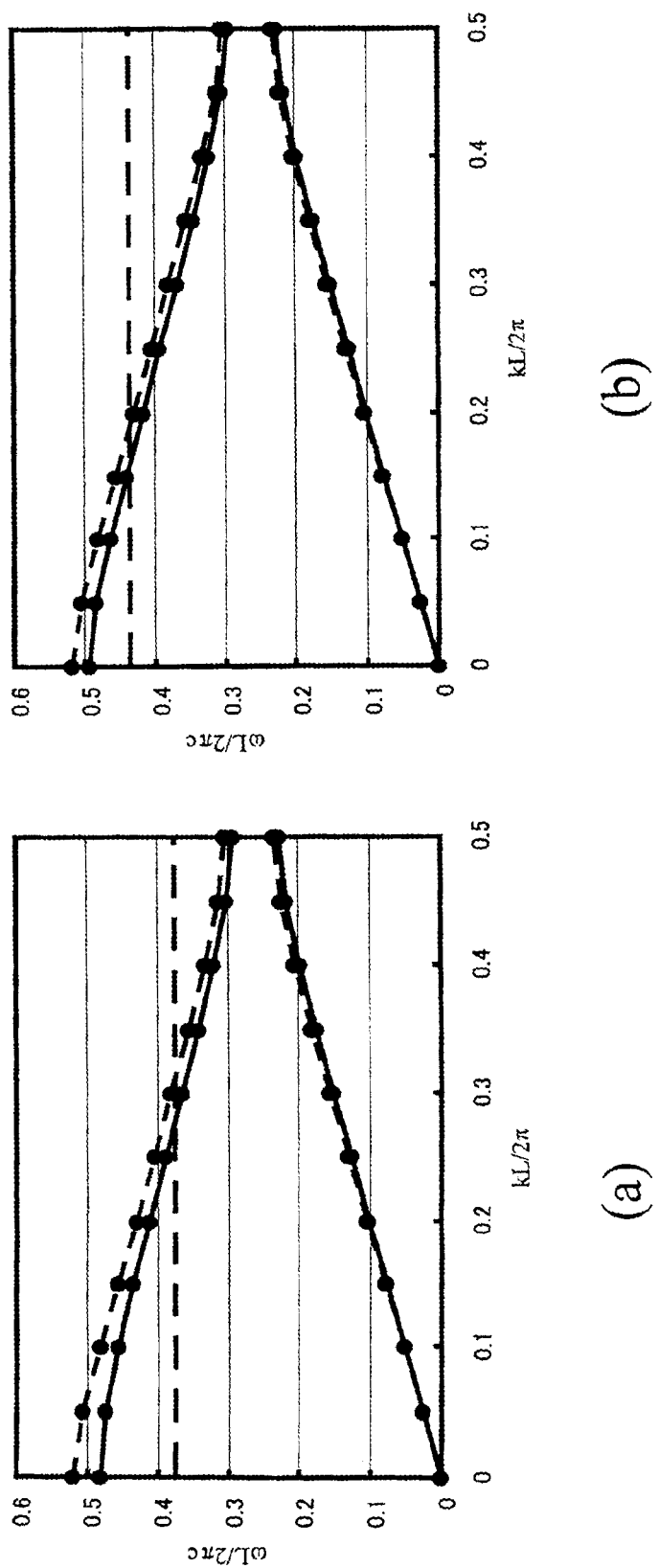
FIGS. 16A and 16B Views showing a photonic band structure.

FIG. 16A shows a photonic band structure for normal incidence in design example 1-4, and FIG. 16B shows a photonic band structure for normal incidence in design example 1-5. In both Figures, the vertical axis indicates a normalized angular frequency ($\omega L/2\pi c$), and the horizontal axis indicates a normalized wavenumber ($kL/2\pi$).

In each Figure, a broken line indicates an incident wavelength of 460 nanometers, a solid line indicates the characteristics of TE polarized light, and a dotted line indicates the characteristics of TM polarized light.

The wavelength of 460 nanometers belongs to the center of the second band in design example 1-4 shown in FIG. 16A, and to a wavelength side that is shorter than the center wavelength of the second band in design example 1-5 shown in FIG. 16B.

Figure 17:
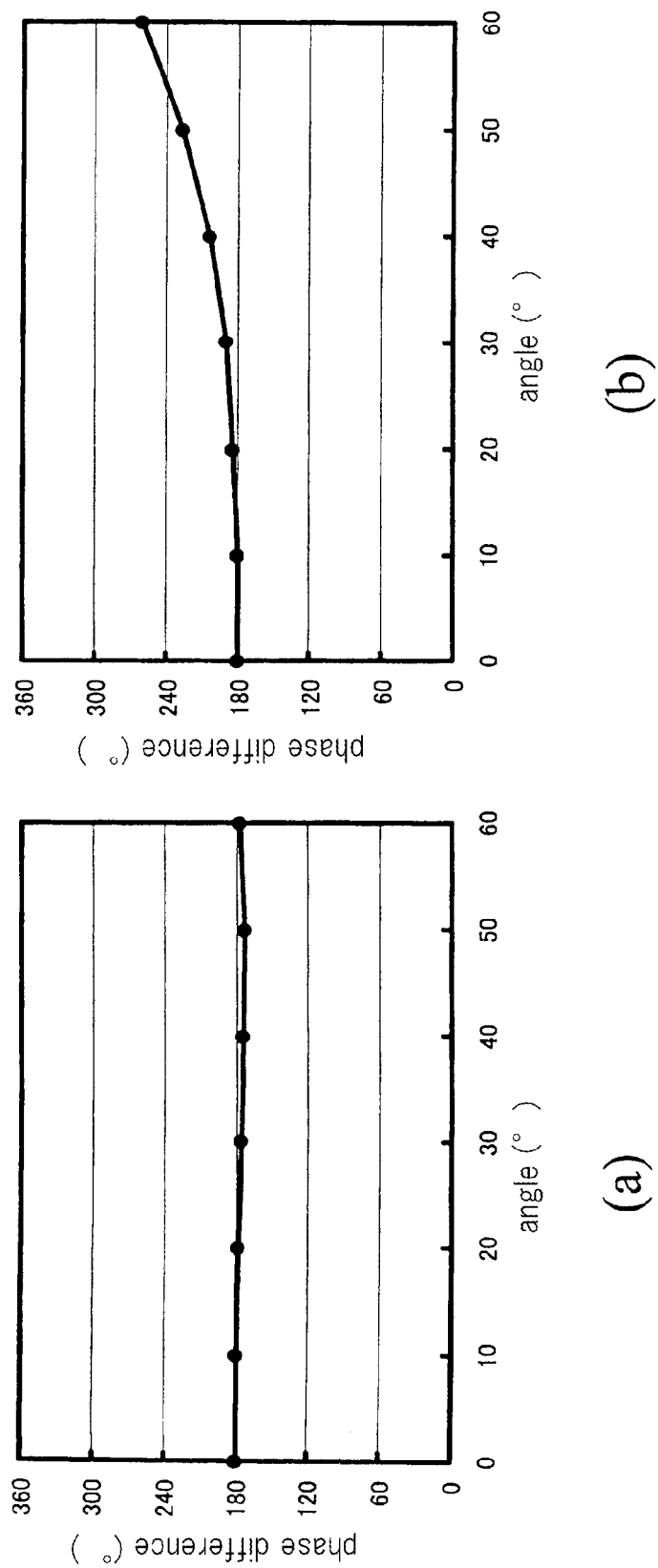
FIGS. 17A and 17B Views showing incident angle dependency in design example 1-4.

FIGS. 17A and 17B show incident angle dependency in design example 1-4: FIG. 17A shows the incident angle dependency within the X-Z plane, and FIG. 17B shows the incident angle dependency within the Y-Z plane. In each Figure, the vertical axis indicates a phase difference, and the horizontal axis indicates an incident angle.

Within the X-Z plane, as shown in FIG. 17A, the phase difference is almost constant irrespective of the increase of the incident angle.

Within the Y-Z plane, as shown in FIG. 17B, the phase difference increases with the increase of the incident angle.

Figure 18:
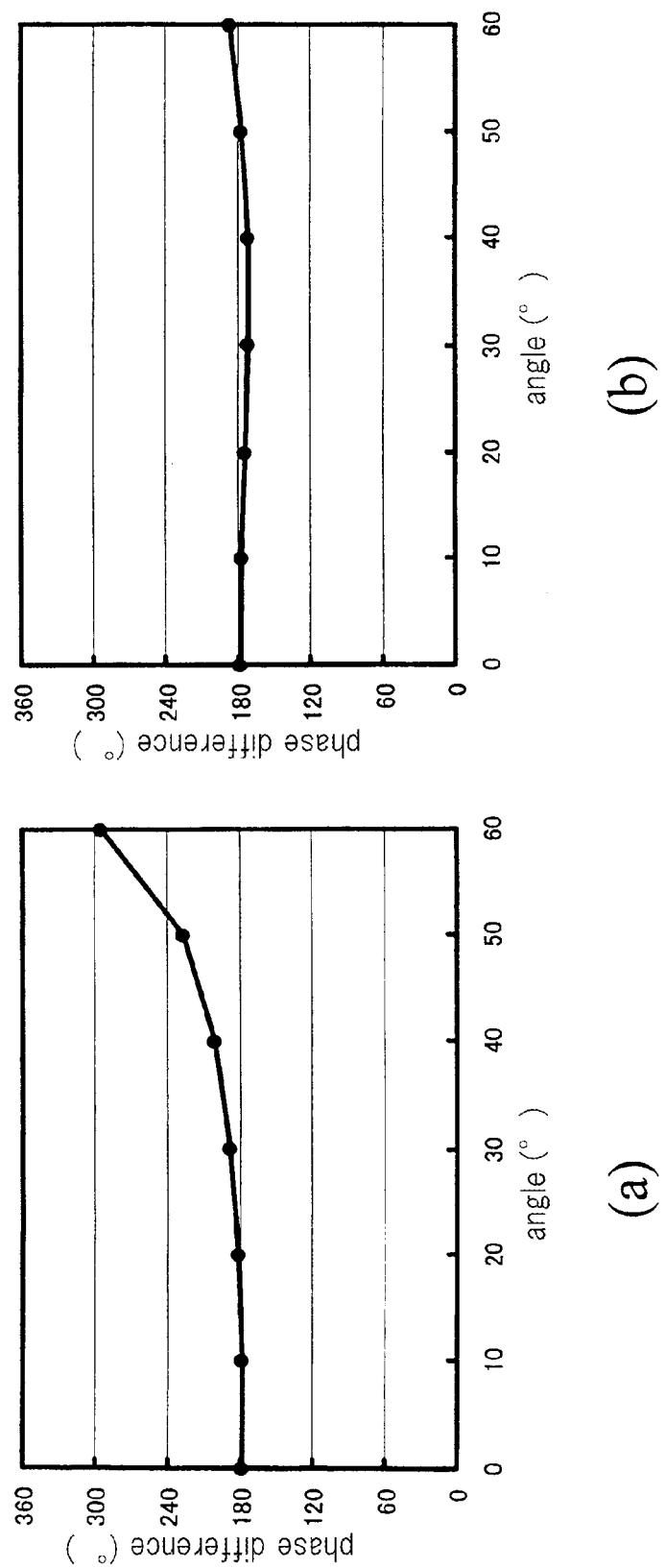
FIGS. 18A and 18B Views showing incident angle dependency in design example 1-5.

FIGS. 18A and 18B show incident angle dependency in design example 1-5: FIG. 18A shows the incident angle dependency within the X-Z plane, and FIG. 18B shows the incident angle dependency within the Y-Z plane. In each Figure, the vertical axis indicates a phase difference, and the horizontal axis indicates an incident angle.

Within the X-Z plane, as shown in FIG. 18A, the phase difference increases with the increase of the incident angle.

Within the Y-Z plane, as shown in FIG. 18B, the phase difference is almost constant irrespective of the increase of the incident angle.

In the combination of the period of design example 1-4 or 1-5 with the other period, the incident angle dependency can not be made flat in the X-Z plane and in the Y-Z plane.

According to the present invention, the incident angle dependency is made flat within both of the X-Z plane and the Y-Z plane by combing the first period, defined so that the used wavelength can belong to the first band, with the second period defined so that the used wavelength can belong to the wavelength side that is longer than the center wavelength of the second band.

Figure 19:
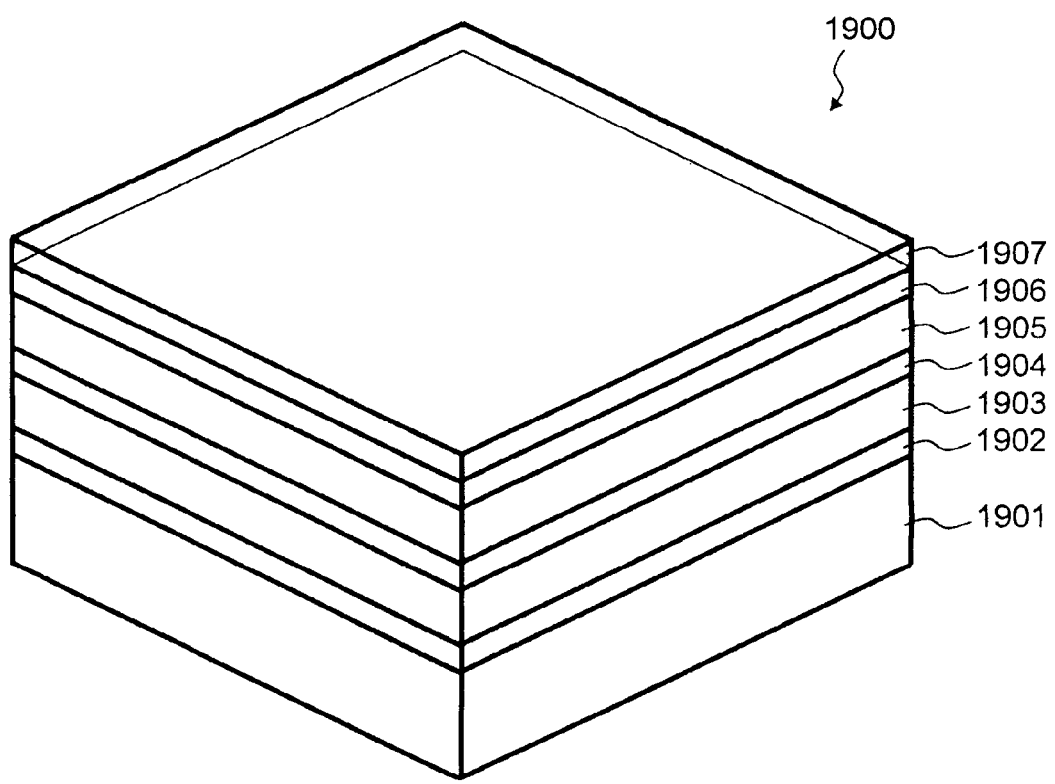
FIG. 19 A perspective view showing the configuration of a light emitting element according to an embodiment of the present invention.

FIG. 19 is a perspective view showing the configuration of a light emitting element according to an embodiment of the present invention. In light emitting element 1900 according to this embodiment, the actual thickness of each layer is very small, and there is a large difference in thickness between the layers. It is consequently difficult to make a drawing where the ratio of each layer is accurate. Thus, FIG. 19 schematically shows each layer that is not drawn with an actual ratio.

Reflection layer 1902 is formed on sub-mount 1901. P-type semiconductor layer 1903 is formed on reflection layer 1902. Light emitting layer 1904 is formed on P-type semiconductor layer 1903. N-type semiconductor layer 1905 is formed on light emitting layer 1904. ¼ wavelength plate layer 1906 is formed on N-type semiconductor layer 1905, and polarizer layer 1907 is formed on ¼ wavelength plate layer 1906.

As a material for sub-mount 1901, for example, Si is used. As a material for reflection layer 1902, for example, Ag is used. As a material for P-type semiconductor layer 1903, for example, GaN doped with Mg is used.

For light emitting layer 1904, for example, the configuration of a multiple quantum well where a layer made of GaN and a layer made of InGaN are alternately stacked is employed. As a material for N-type semiconductor layer 1905, for example, GaN doped with Si is used.

A method for manufacturing light emitting element 1900 will be described. First, N-type semiconductor layer 1905, light emitting layer 1904, P-type semiconductor layer 1903, and reflection layer 1902 are sequentially formed on the substrate. Then, reflection layer 1902 is bonded onto sub-mount 1901 to remove the substrate.

Then, ¼ wavelength plate layer 1906 made of a material whose thickness is the same as that shown in design example 1-3 or 2-3 is formed by another process to be bonded onto N-type semiconductor layer 1905. The number of stacked layers is set to be half of that of design example 1-3 or 2-3. Then, polarizer layer 1907 is formed by another process to be bonded onto ¼ wavelength plate layer 1906. For polarizer layer 1907, for example, the polarization separation element disclosed in Patent Literature 2 is used.

The operation of this embodiment will be described in outline. By applying a voltage between P-type semiconductor layer 1903 and N-type semiconductor layer 1905, and by applying current between these layers, light is generated on light emitting layer 1904. The light generated on light emitting layer 1904 contains components oriented in various directions.

The light generated on light emitting layer 1904 and directed to N-type semiconductor layer 1905 is transmitted through ¼ wavelength plate layer 1906 to enter into polarizer layer 1907.

The light generated on light emitting layer 1904 and directed to P-type semiconductor layer 1903 is transmitted through P-type semiconductor layer 1903 to be reflected on reflection layer 1902, is then transmitted through P-type semiconductor layer 1903, light emitting layer 1904, and N-type semiconductor layer 1905, and transmitted through ¼ wavelength plate layer 1906 to enter into polarizer layer 1907.

In the light emitting element thus configured according to this embodiment, linearly polarized lights made uniform in a polarizing direction by polarizer layer 1907 are emitted. The light reflected on polarizer layer 1907 is reflected on reflection layer 1902, and its polarizing direction is changed by ¼ wavelength plate layer 1906 to enter into polarizer layer 1907 again. Since ¼ wavelength plate layer 1906, which is made of a material whose thickness is the same as that shown in design example 1-3 or 2-3 (number of stacked layers is half of that of design example 1-3 or 2-3), has high incident angle tolerance, the light emitting element that is capable of emitting linearly polarized lights within a wide angle range is realized.

Figure 20:
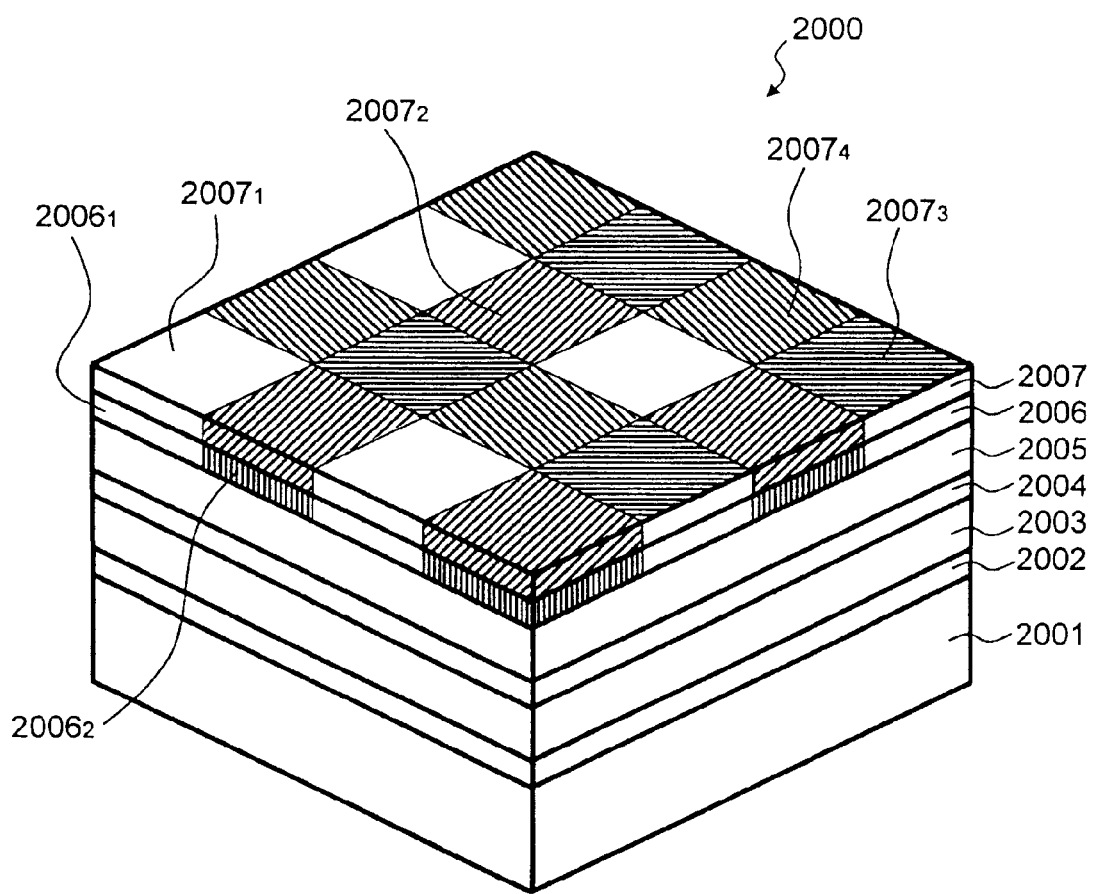
FIG. 20 A perspective view showing the configuration of a light emitting element of the present invention according to another embodiment.

FIG. 20 is a sectional view showing the configuration of a light emitting element according to another embodiment of the present invention. In light emitting element 2000 according to this embodiment, the actual thickness of each layer is very small, and there is a large difference in thickness between the layers. It is consequently difficult to make a drawing where the ratio of each layer is accurate. Thus, FIG. 20 schematically shows each layer that is not drawn with an actual ratio.

Reflection layer 2002 is formed on sub-mount 2001. P-type semiconductor layer 2003 is formed on reflection layer 2002. Light emitting layer 2004 is formed on P-type semiconductor layer 2003. N-type semiconductor layer 2005 is formed on light emitting layer 2004. Polarizer layer 2006 is formed on N-type semiconductor layer 2005. ½ wavelength plate layer 2007 is formed on polarization layer 2006.

As a material for sub-mount 2001, for example, Si is used. As a material for reflection layer 2002, for example, Ag is used. As a material for P-type semiconductor layer 2003, for example, GaN doped with Mg is used.

For light emitting layer 2004, for example, the configuration of a multiple quantum well where a layer made of GaN and a layer made of InGaN are alternately stacked is used. As a material for N-type semiconductor layer 2005, for example, GaN doped with Si is used.

A method for manufacturing light emitting element 2000 will be described. First, N-type semiconductor layer 2005, light emitting layer 2004, P-type semiconductor layer 2003, and reflection layer 2002 are sequentially formed on the substrate. Then, reflection layer 2002 is bonded onto sub-mount 2001 to remove the substrate.

Then, polarizer layer 2006 is formed by another process to be bonded onto N-type semiconductor layer 2005. For polarizer layer 2006, for example, the polarization separation element disclosed in Patent Literature 2 is used. Then, ½ wavelength plate layer 2007 made of a material whose number of stacked layers and whose thickness is the same as that shown in design example 1-3 or 2-3 is formed by another process to be bonded onto polarizer layer 2006.

The operation of this embodiment will be described in outline. By applying a voltage between P-type semiconductor layer 2003 and N-type semiconductor layer 2005, and by applying current between these layers, light is generated on light emitting layer 2004. The light generated on light emitting layer 2004 contains components oriented in various directions.

The light generated on light emitting layer 2004 and directed to N-type semiconductor layer 2005 is transmitted through N-type semiconductor layer 2005 to enter into polarizer layer 2006. The light generated on light emitting layer 2004 and directed to P-type semiconductor layer 2003 is transmitted through P-type semiconductor layer 2003 to be reflected on reflection layer 2002, and is then transmitted through P-type semiconductor layer 2003, light emitting layer 2004, and N-type semiconductor layer 2005 to enter into polarizer layer 2006.

Polarization layer 2006 has first area $2006_1$ and second area $2006_2$. First area $2006_1$ transmits, from among incident lights, a polarization component of a first direction while reflecting other polarization components. Second area $2006_2$ transmits, from among the incident lights, a polarization component of a second direction orthogonal to the first direction while reflecting other polarization components. Specifically, from among the lights made incident on polarization layer 2006, the polarization component of the first direction made incident on first area $2006_1$ and the polarization component of the second direction made incident on second area $2006_2$ are transmitted through polarization layer 2006 while the polarization component of the second direction made incident on first area $2006_1$ and the polarization component of the first direction made incident on second area $2006_2$ are reflected on polarization layer 2006.

The light reflected on polarization layer 2006 is transmitted through N-type semiconductor layer 2005, light emitting layer 2004, and P-type semiconductor layer 2003 to be reflected on reflection layer 2002, and is then transmitted through P-type semiconductor layer 2003, light emitting layer 2004, and N-type semiconductor layer 2005 to enter into polarization layer 2006 again. In this case, the incident position is different from that of the previous case and, from among the lights made incident on polarization layer 2006 again, the polarization component of the first direction made incident on first area $2006_1$ and the polarization component of the second direction made incident on second area $2006_2$ are transmitted through polarization layer 2006 while the polarization component of the second direction made incident on first area $2006_1$ and the polarization component of the first direction made incident on second area $2006_2$ are reflected again on polarization layer 2006. By repeating this operation, all the lights generated on light emitting layer 2004 are eventually transmitted through polarization layer 2006.

½ wavelength plate layer 2007 has first to fourth areas $2007_1$ to $2007_4$. First area $2007_1$ and third area $2007_3$ of ½ wavelength plate layer 2007 are provided corresponding to first area $2006_1$ of polarization layer 2006, and second area $2007_2$ and fourth area $2007_4$ of ½ wavelength plate layer 2007 are provided corresponding to second area $2006_2$ of polarization layer 2006. From first area $2007_1$ and third area $2007_3$, the incident lights exit without being given any polarization rotational angle. From second area $2007_2$ and fourth area $2007_4$, the incident lights exit by being respectively given polarization rotational angles of 90 degrees and 270 degrees. As a result, the lights transmitted through first to fourth areas $2007_1$ to $2007_4$ of wavelength plate layer 2007 are made uniform in the polarizing direction.

In the light emitting element thus configured according to this embodiment, linearly polarized lights made uniform in a polarizing direction by ½ wavelength plate layer 2007 are emitted. Since ½ wavelength plate layer 2007, which is made of a material whose number of stacked layers and whose thickness is the same as that shown in design example 1-3 or 2-3, has high incident angle tolerance, the light emitting element that is capable of emitting linearly polarized lights within a wide angle range is realized.

Figure 21:
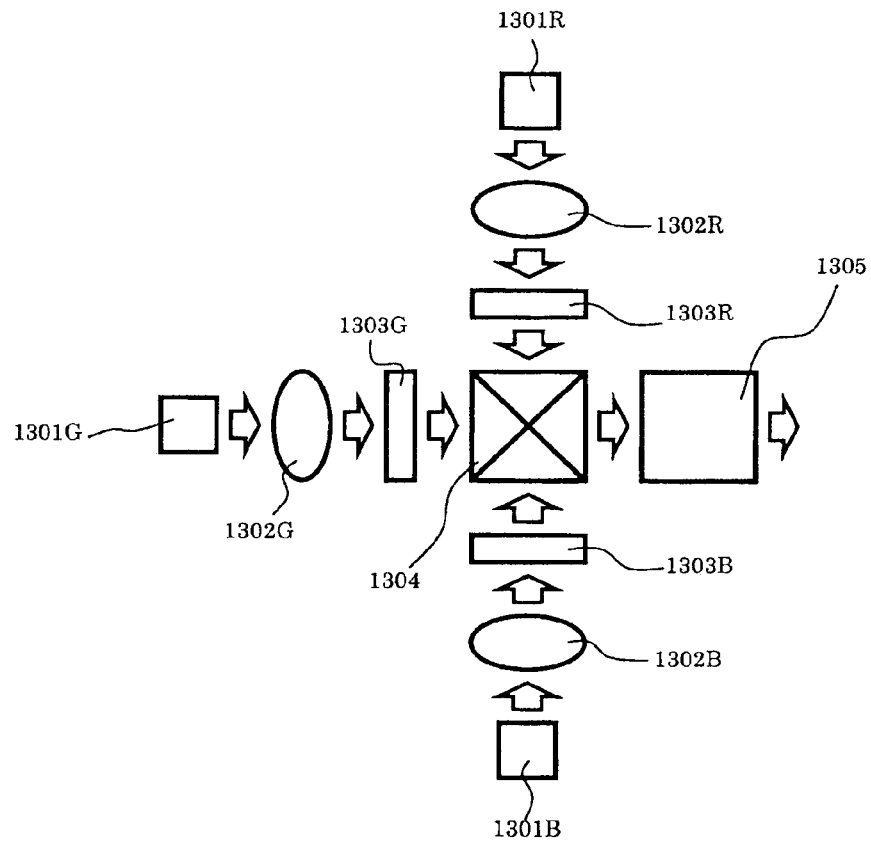
FIG. 21 A block diagram showing the configuration of an image display device that uses the light emitting element of the present invention according to an embodiment.

FIG. 21 is a block diagram showing the configuration of an image display device that uses the light emitting element of the present invention according to an embodiment. The image display device of this embodiment forms an image by using liquid crystal display elements 1303R, 1303G, and 1303B that include a plurality of pixels. Each pixel includes liquid crystal molecules individually controllable for orientation direction.

The image display device shown in FIG. 21 includes light source unit 1301R that generates red light, light source unit 1301G that generates green light, and light source unit 1301B that generates blue light. Each of these light source units is configured by using four light emitting elements of the present invention and a rod integrator.

The red light generated by light source unit 1301R is applied to liquid crystal display element 1303R that displays a red image via condenser lens 1302R, and accordingly red image light generated in liquid crystal display element 1303R enters into color synthesis prism 1304.

The green light generated by light source unit 1301G is applied to liquid crystal display element 1303G that displays a green image via condenser lens 1302G, and accordingly green image light generated in liquid crystal display element 1303G enters into color synthesis prism 1304.

The blue light generated by light source unit 1301B is applied to liquid crystal display element 1303B that displays a blue image via condenser lens 1302B, and accordingly blue image light generated in liquid crystal display element 1303B enters into color synthesis prism 1304.

The red image light, the green image light, and the blue image light that have entered into color synthesis prism 1304 are synthesized by color synthesis prism 1304, and the synthesized image light is projected to the screen via projection lens 1305.

There is no light loss of 50% in any of liquid crystal display elements 1303R in the image display device according to this embodiment, as compared with the image display device of a similar configuration that uses light source units that are not uniform in the polarized states of emitted lights, and thus luminance can be doubled. Because of the use of the light source units having light emitting elements that are capable of emitting linearly polarized lights within the wide angle range, even when the F-number of projection lens 1305 is reduced or when the areas of liquid crystal display elements 1303R, 1303G, and 1303B are set large, light use efficiency is high, and the luminance can be further increased.

Figure 22:
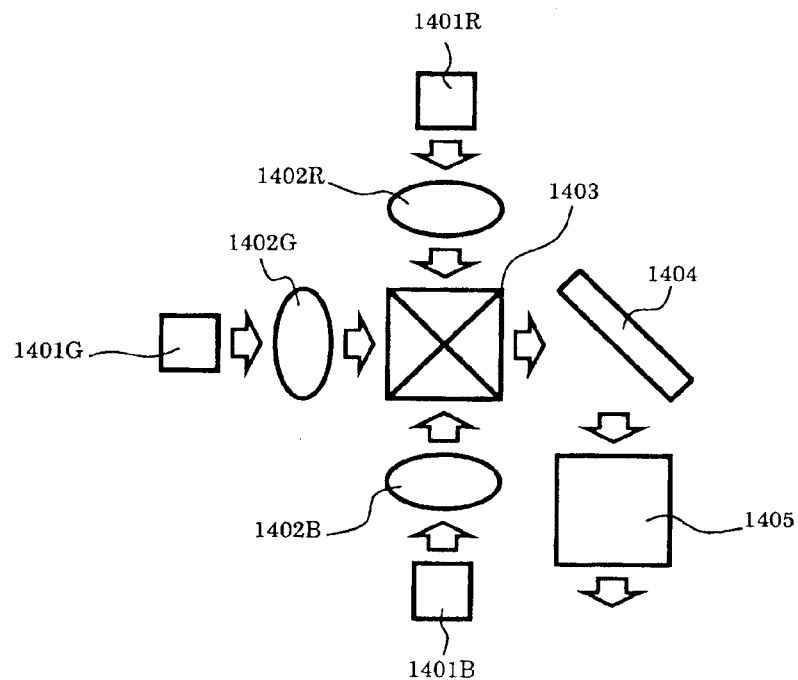
FIG. 22 A block diagram showing the configuration of an image display device that uses the light emitting element of the present invention according to another embodiment.

FIG. 22 is a block diagram showing the configuration of an image display device that uses the light emitting element of the present invention according to another embodiment. The image display device according to this embodiment forms an image by using micromirror 1404 that includes a plurality of pixels. Each pixel includes a micromirror individually controllable for angle.

The image display device shown in FIG. 22 includes light source unit 1401R that generates red light, light source unit 1401G that generates green light, and light source unit 1401B that generates blue light. Each of these light source units is configured by using four light emitting elements of the present invention and a rod integrator.

The red light generated by light source unit 1401R enters into color synthesis prism 1403 via condenser lens 1402R. The green light generated by light source unit 1401G enters into color synthesis prism 1403 via condenser lens 1402G. The blue light generated by light source unit 1401B enters into color synthesis prism 1403 via condenser lens 1402B.

Light source unit 1401R, light source unit 1401G, and light source unit 1401B can be controlled so that the lighting states of the respective colors can be sequentially switched, and the red light, the green light, and the blue light are sequentially applied from color synthesis prism 1403 to micromirror 1404.

Mircromirror 1404 sequentially displays images corresponding to the colors of the applied lights. Accordingly, the red image light, the green image light, and the blue image light generated by micromirror 1404 are sequentially projected to the screen via projection lens 1405.

Color synthesis prism 1403 reflects all the S-polarized components of the red light, transmits all the P-polarized components of the green light, and reflects all the S-polarized components of the blue light. However, color synthesis prism 1403 reflects only a part of the P-polarized components of the red light, transmits only a part of the S-polarized components of the green light, and reflects only a part of the P-polarized components of the blue light.

Thus, when the polarized states of lights output from the light source units are not uniform, no loss of light occurs in any of the red, green and blue lights for one polarized component in color synthesis prism 1403. However, light loss occurs for the other polarized component.

On the other hand, when the lights output from the light source units are linearly polarized lights, the red light, the green light, and the blue light enter respectively as S-polarized light, P-polarized light, and S-polarized light into color synthesis prism 1403. Accordingly, there is no light loss in any of the red, green and blue lights in color synthesis prism 1403.

In the image display device according to this embodiment, as compared with the image display device of a similar configuration using light source units in which the output polarized states of the emitted lights are not uniform, no light loss occurs in color synthesis prism 1403, and thus luminance can be increased. Because of the use of the light source units having the light emitting elements capable of emitting linearly polarized lights within a wide angle range, even when the F-number of projection lens 1405 is reduced or when the area of micromirror 1404 is set large, light use efficiency is high, and the luminance can be further increased.

Figure 23:
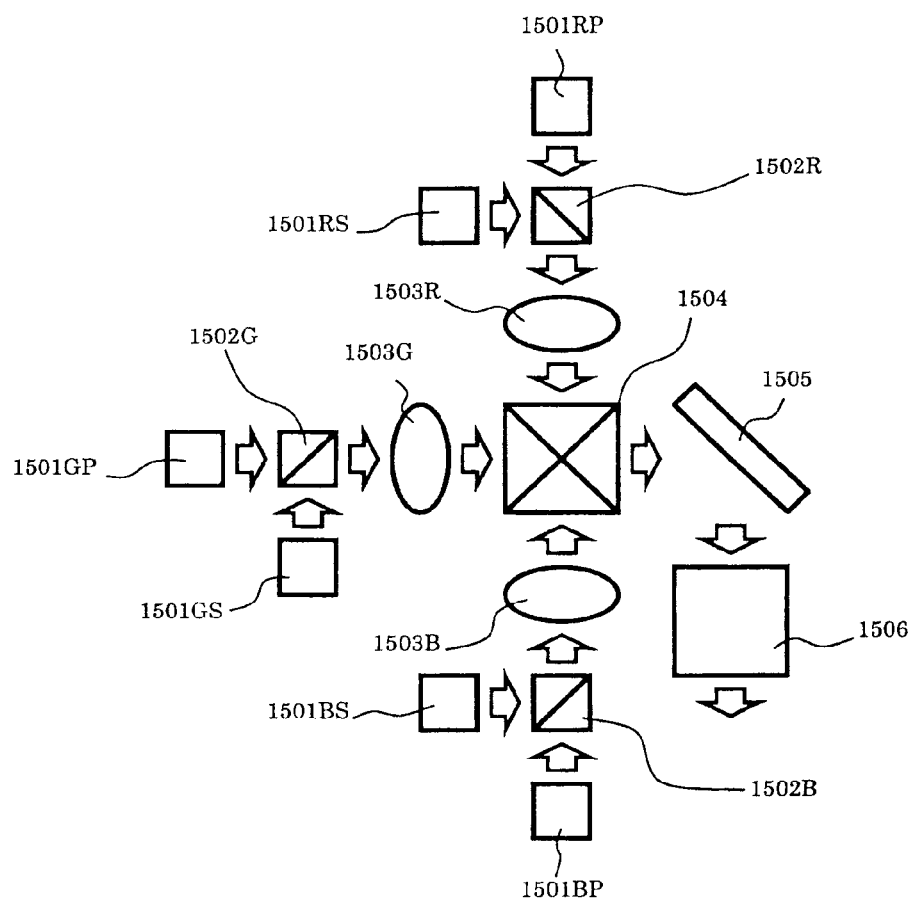
FIG. 23 A block diagram showing the configuration of an image display device that uses the light emitting element of the present invention according to yet another embodiment.

FIG. 23 is a block diagram showing the configuration of an image display device that uses the light emitting element of the present invention according to yet another embodiment. The image display device according to this embodiment forms an image by using micromirror 1505 including a plurality of pixels. Each pixel are made from micromirror which are individually controllable.

The image display device shown in FIG. 23 includes light source units 1501RP and 1501RS that generate red lights, light source units 1501GP and 1501GS that generate green lights, and light source units 1501BP and 1501BS that generate blue lights. Each of these light source units is configured by using one or more light emitting elements of the present invention described above referring to FIG. 19 or FIG. 20.

The red lights generated by light source units 1501RP and 1501RS enter respectively as P-polarized light and S-polarized light into polarization beam splitter 1502R. Polarization beam splitter 1502R transmits the P-polarized light while reflecting the S-polarized light. Accordingly, the red lights generated by light source units 1501RP and 1501RS are synthesized at polarization beam splitter 1502R, and the synthesized red light enters into color synthesis prism 1504 via condenser lens 1503R.

The green lights generated by light source units 1501GP and 1501GS enter respectively as P-polarized light and S-polarized light into polarization beam splitter 1502G. Polarization beam splitter 1502G transmits the P-polarized light while reflecting the S-polarized light. Accordingly, the green lights generated by light source units 1501GP and 1501GS are synthesized at polarization beam splitter 1502G, and the synthesized red light enters into color synthesis prism 1504 via condenser lens 1503G.

The blue lights generated by light source units 1501BP and 1501BS enter respectively as P-polarized light and S-polarized light into polarization beam splitter 1502B. Polarization beam splitter 1502B transmits the P-polarized light while reflecting the S-polarized light. Accordingly, the blue lights generated by light source units 1501P and 1501BS are synthesized at polarization beam splitter 1502B, and the synthesized red light enters into color synthesis prism 1504 via condenser lens 1503B.

Light source units 1501RP and 1501GP, light source units 1501GP and 1501GS, and light source units 1501BP and 1501BS can be controlled so that the lighting states of the respective colors can be sequentially switched, and the red light, the green light, and the blue light are sequentially applied from color synthesis prism 1504 to the screen.

Mircromirror 1505 sequentially displays images corresponding to the colors of the applied lights. Accordingly, the red image light, the green image light, and the blue image light generated by micromirror 1505 are sequentially projected to the screen via projection lens 1506.

When the polarized states of the lights output from the light source units are not uniform, light loss of 50% occurs at the polarization beam splitter. Thus, as compared with the image display device of the configuration shown in FIG. 22, luminance cannot be increased even when the number of light source units is twice as large.

On the other hand, when the lights output from the light source units are linearly polarized lights, a 50% light loss does not occur at the polarization beam splitter. Thus, as compared with the image display device of the configuration shown in FIG. 22, luminance can be doubled because the number of light source units is twice as large. Because of the use of the light source units having the light emitting elements capable of emitting linearly polarized lights within a wide angle range, even when the F-number of projection lens 1506 is reduced or even when the area of micromirror 1505 is set large, light use efficiency is high, and the luminance can be further increased.

Figure 24:
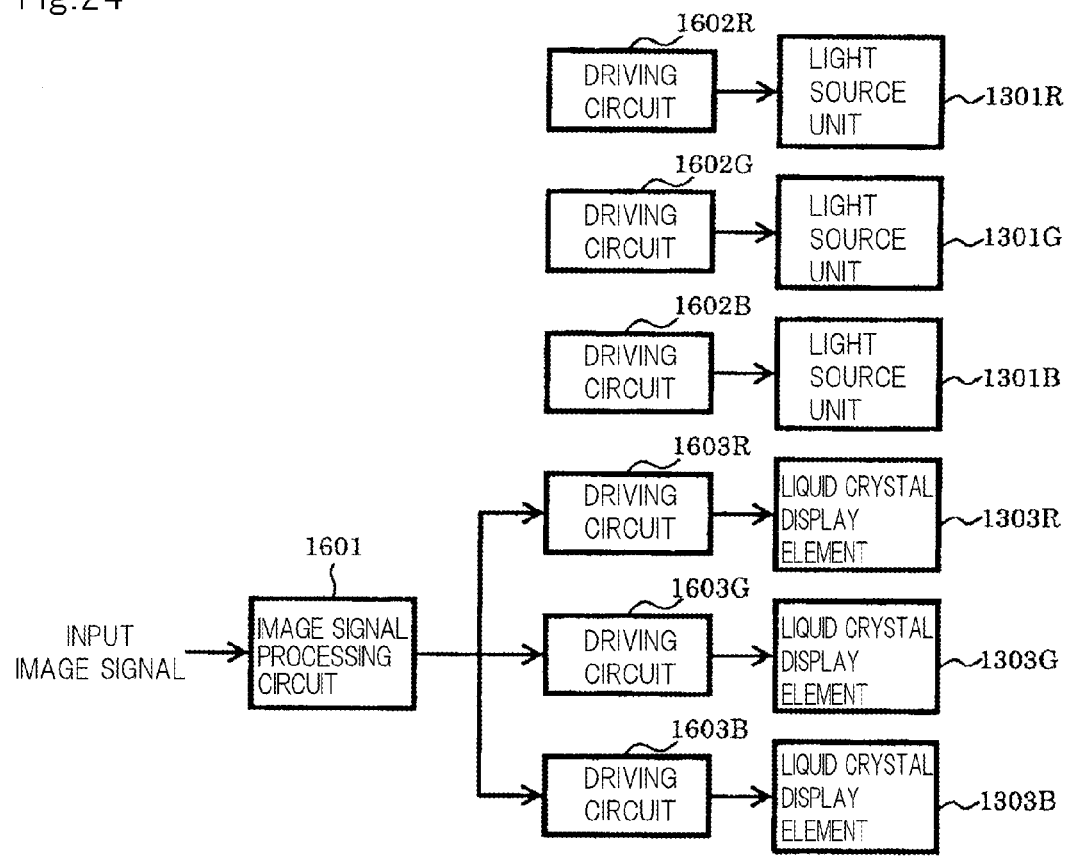
FIG. 24 A view showing the configuration of the driving system of the image display device shown in FIG. 21.

FIG. 24 shows the configuration of the driving system of the image display device shown in FIG. 21.

Driving circuits 1602R, 1602G, and 1602B respectively drive light source units 1301R, 1301G, and 1301B. Accordingly, light source units 1301R, 1301G, and 1301B are always lit during an image display operation. Light source units 1301R, 1301G, and 1301B can be driven by one driving circuit.

Image signal processing circuit 1601 generates signals to display a red image, a green image, and a blue image according to an from an external PC (personal computer) or an image reproduction device, and supplies the respective signals to driving circuits 1603R, 1603G, and 1603B.

Driving circuits 1603R, 1603G, and 1603B respectively drive liquid crystal display elements 1303R, 1303G, and 1303B based on the signals supplied from image signal processing circuit 1601. Accordingly, liquid crystal display elements 1303R, 1303G, and 1303B respectively display the red image, the green image, and the blue image.

Figure 25:
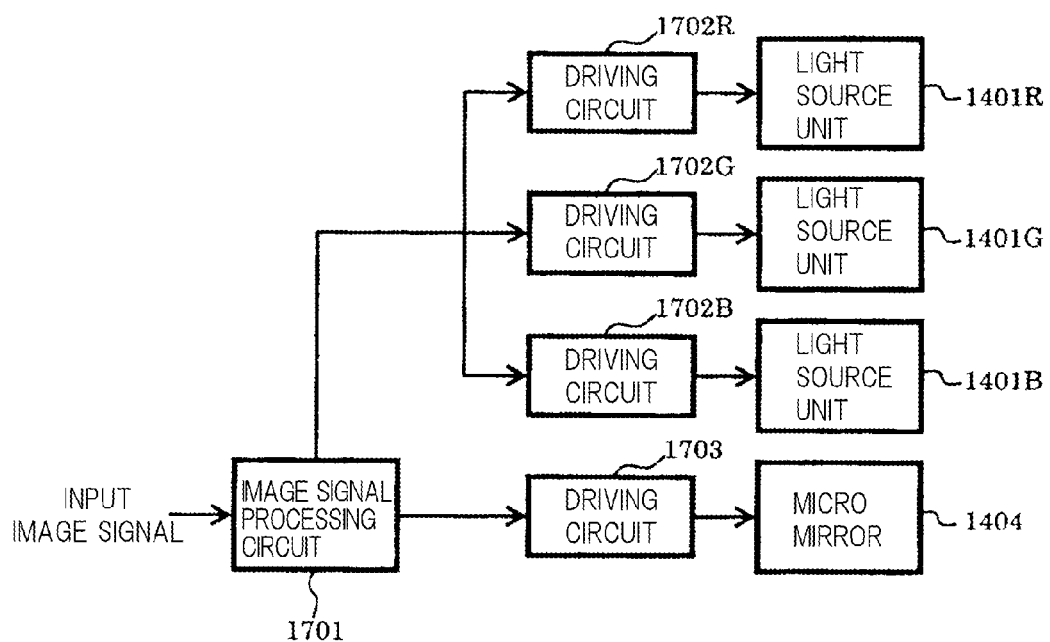
FIG. 25 A view showing the configuration of the driving system of the image display device shown in FIG. 22.

FIG. 25 shows the configuration of the driving system of the image display device shown in FIG. 22.

Image signal processing circuit 1701 generates signals to display a red image, a green image, and a blue image according to an input image signal from an external PC (personal computer) or an image reproduction device, and sequentially supplies the signals to driving circuit 1703.

Image signal processing circuit 1701 generates, simultaneously with supplying the signal to display the red image to driving circuit 1703, a signal to generate red light and supplies this signal to driving circuit 1702R, generates, simultaneously with supplying the signal to display the green image to driving circuit 1703, a signal to generate green light and supplies this signal to driving circuit 1702G, and generates, simultaneously with supplying the signal to display the blue image to driving circuit 1703, a signal to generate blue light and supplies this signal to driving circuit 1702B.

Driving circuit 1703 drives micromirror 1404 based on the signals supplied from image signal processing circuit 1701. Accordingly, micromirror 1404 sequentially displays the red image, the green image, and the blue image.

Driving circuits 1702R, 1702G, and 1702B drive light source units 1401R, 1401G, and 1401B based on the signals supplied from image signal processing circuit 1701. Accordingly, light source unit 1401R is lit while micromirror 1404 displays the red image, light source unit 1401G is lit while micromirror 1404 displays the green image, and light source unit 1401B is lit while micromirror 1404 displays the blue image.

Figure 26:
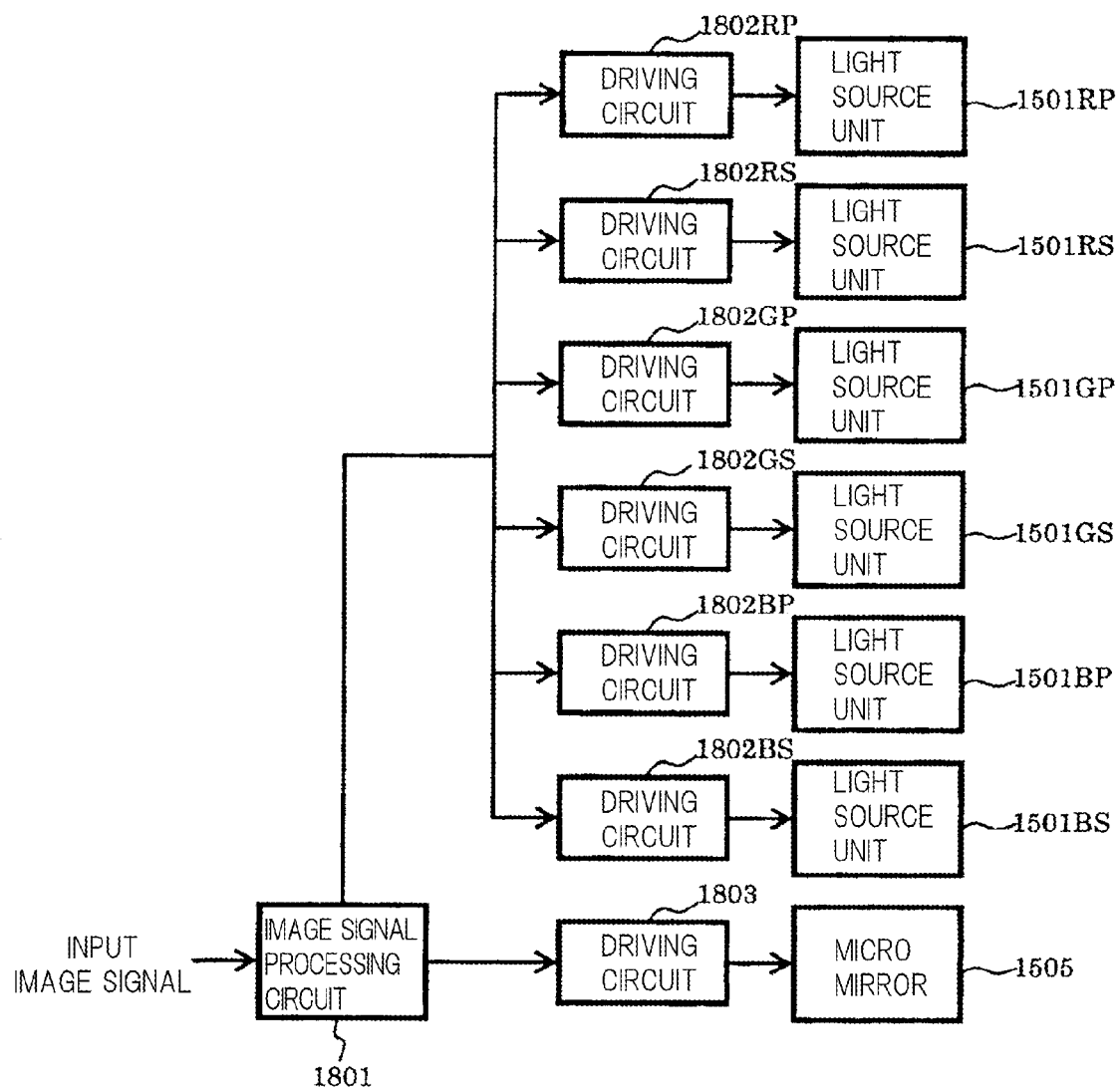
FIG. 26 A view showing the configuration of the driving system of the image display device shown in FIG. 23.

FIG. 26 shows the configuration of the driving system of the image display device shown in FIG. 23.

Image signal processing circuit 1801 generates signals to display a red image, a green image, and a blue image according to an input image signal from an external PC (personal computer) or an image reproduction device, and sequentially supplies the signals to driving circuit 1803.

Image signal processing circuit 1801 generates, simultaneously with supplying the signal to display the red image to driving circuit 1803, a signal to generate red light and supplies this signal to driving circuits 1802RP and 1802RS, generates, simultaneously with supplying the signal to display the green image to driving circuit 1803, a signal to generate green light and supplies this signal to driving circuit 1802GP and 1802GS, and generates, simultaneously with supplying the signal to display the blue image to driving circuit 1803, a signal to generate blue light and supplies this signal to driving circuit 1802BP and 1802BS.

Driving circuit 1803 drives micromirror 1505 based on the signals supplied from image signal processing circuit 1801. Accordingly, micromirror 1505 sequentially displays the red image, the green image, and the blue image.

Driving circuits 1802RP, 1802RS, 1802G,P, 1802GS, 1802BP, and 1802BS drive light source units 1501RP, 1501RS, 1501GP, 1501GS, 1501BP, and 1501BS based on the signals supplied from image signal processing circuit 1801. Accordingly, light source units 1501RP and 1501RS are lit while micromirror 1505 displays the red image, light source unit 1501GP and 1501GS are lit while micromirror 1505 displays the green image, and light source units 1501BP and 1501BS are lit while micromirror 1505 displays the blue image.

This application claims priority from Japanese Patent Application No. 2010-087805 filed on Apr. 6, 2010, which is hereby incorporated by reference herein in its entirety.

REFERENCE NUMERAL

100 Wavelength plate
101 Substrate
102 High refractive index layer
103 Low refractive index layer

The invention claimed is:

1. A wavelength plate in which a high refractive index layer and a low refractive index layer are alternately stacked, each layer having a concave-convex structure a period of which is equal to or shorter that a wavelength in one direction within a plane, comprising, as periods in a thickness direction of the high refractive index layer and the low refractive index layer:
    a first period defined so that a used wavelength can belong to a first band of a photonic band structure; and
    a second period defined so that the used wavelength can belong to a wavelength side longer than a center wavelength of the second band of the photonic band structure.

2. A light emitting element having the wavelength plate of claim 1, comprising:
    a light emitting layer for emitting light;
    a polarizer and the wavelength plate arranged on an exit surface side with respect to the light emitting layer; and
    a reflection layer disposed on a side opposite the exit surface with respect to the light emitting layer.

3. An image display device using the light emitting element of claim 2.

* * * * *